(12) United States Patent
Tan et al.

(10) Patent No.: US 9,177,921 B2
(45) Date of Patent: Nov. 3, 2015

(54) MANUFACTURING METHOD OF SEMICONDUCTOR DEVICE

(71) Applicant: FUJIFILM CORPORATION, Tokyo (JP)

(72) Inventors: Shiro Tan, Shizuoka (JP); Kazuhiro Fujimaki, Shizuoka (JP); Yu Iwai, Shizuoka (JP); Ichiro Koyama, Shizuoka (JP); Atsushi Nakamura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/324,626

(22) Filed: Jul. 7, 2014

(65) Prior Publication Data
US 2014/0322893 A1    Oct. 30, 2014

Related U.S. Application Data

(63) Continuation of application No. PCT/JP2013/056379, filed on Mar. 1, 2013.

(30) Foreign Application Priority Data

Mar. 2, 2012 (JP) .................................. 2012-046856
Jun. 13, 2012 (JP) .................................. 2012-134188

(51) Int. Cl.
*H01L 21/00* (2006.01)
*H01L 23/00* (2006.01)
(Continued)

(52) U.S. Cl.
CPC ........ *H01L 23/562* (2013.01); *H01L 21/67115* (2013.01); *H01L 21/6835* (2013.01);
(Continued)

(58) Field of Classification Search
None
See application file for complete search history.

(56) References Cited

U.S. PATENT DOCUMENTS

2002/0127821 A1    9/2002   Ohya et al.
2005/0233547 A1*  10/2005   Noda et al. .................... 438/459
(Continued)

FOREIGN PATENT DOCUMENTS

JP    2003-37155 A    2/2003
JP    2008-306049 A   12/2008
(Continued)

OTHER PUBLICATIONS

International Search Report dated Jun. 11, 2013 issued in in International Application No. PCT/JP2013/056379 (PCT/ISA/210).
(Continued)

*Primary Examiner* — Charles Garber
*Assistant Examiner* — Evren Seven
(74) *Attorney, Agent, or Firm* — Sughrue Mion, PLLC

(57) ABSTRACT

A method for manufacturing a semiconductor device with a treated member, includes: subjecting an adhesive support having a substrate and an adhesive layer capable of increasing or decreasing in adhesiveness upon irradiation with an actinic ray, radiation or heat to irradiation of the adhesive layer with an actinic ray, radiation or heat, adhering a first surface of a to-be-treated member to the adhesive layer of the adhesive support, applying a mechanical or chemical treatment to a second surface different from the first surface of the to-be-treated member to obtain a treated member, and detaching a first surface of the treated member from the adhesive layer of the adhesive support, wherein the irradiation of the adhesive layer with an actinic ray, radiation or heat is conducted so that adhesiveness decreases toward an outer surface from an inner surface on the substrate side of the adhesive layer.

14 Claims, 7 Drawing Sheets

(51) Int. Cl.
*H01L 21/67* (2006.01)
*H01L 21/683* (2006.01)

(52) U.S. Cl.
CPC ..... *H01L21/6836* (2013.01); *H01L 2221/6834* (2013.01); *H01L 2221/68318* (2013.01); *H01L 2221/68327* (2013.01); *H01L 2221/68381* (2013.01); *H01L 2924/0002* (2013.01)

(56) References Cited

U.S. PATENT DOCUMENTS

| | | |
|---|---|---|
| 2007/0077685 A1* | 4/2007 | Noda et al. ............... 438/107 |
| 2008/0182387 A1* | 7/2008 | Feng et al. ............... 438/465 |
| 2008/0305721 A1 | 12/2008 | Ohashi et al. |
| 2009/0017323 A1* | 1/2009 | Webb et al. ............... 428/521 |
| 2009/0115075 A1* | 5/2009 | Kessel et al. ............... 257/787 |
| 2010/0041211 A1* | 2/2010 | Noda et al. ............... 438/464 |
| 2010/0043608 A1 | 2/2010 | Jakob |
| 2011/0136321 A1 | 6/2011 | Kuroda et al. |
| 2011/0180885 A1* | 7/2011 | Pahl et al. ............... 257/415 |
| 2011/0237050 A1* | 9/2011 | Sugimura et al. ............... 438/465 |
| 2012/0171843 A1* | 7/2012 | Yamaguchi et al. ............... 438/458 |
| 2013/0084459 A1* | 4/2013 | Larson et al. ............... 428/422 |

FOREIGN PATENT DOCUMENTS

| | | |
|---|---|---|
| JP | 2009-528688 A | 8/2009 |
| JP | 2011-119427 A | 6/2011 |
| JP | 2011-181941 A | 9/2011 |
| JP | 2011-249589 A | 12/2011 |

OTHER PUBLICATIONS

Written Opinion dated Jun. 11, 2013 issued in in International Application No. PCT/JP2013/056379 (PCT/ISA/237).

Office Action dated Jul. 7, 2015, issued by the Japanese Patent Office in counterpart Japanese Application No. 2012-134188.

* cited by examiner

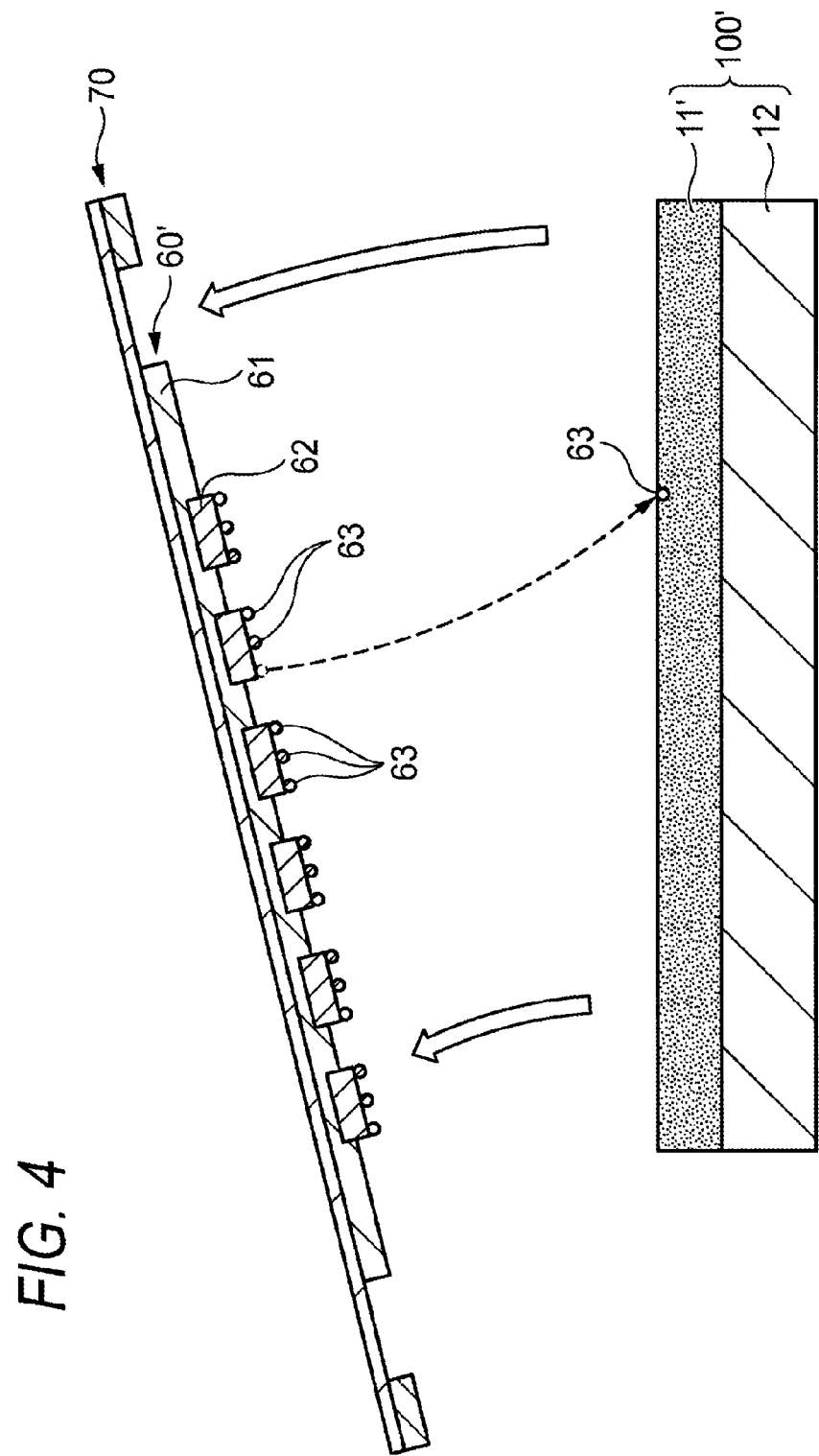

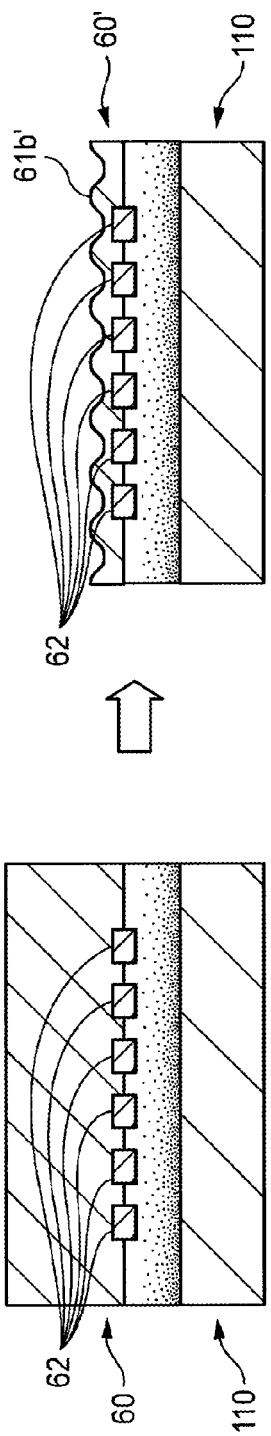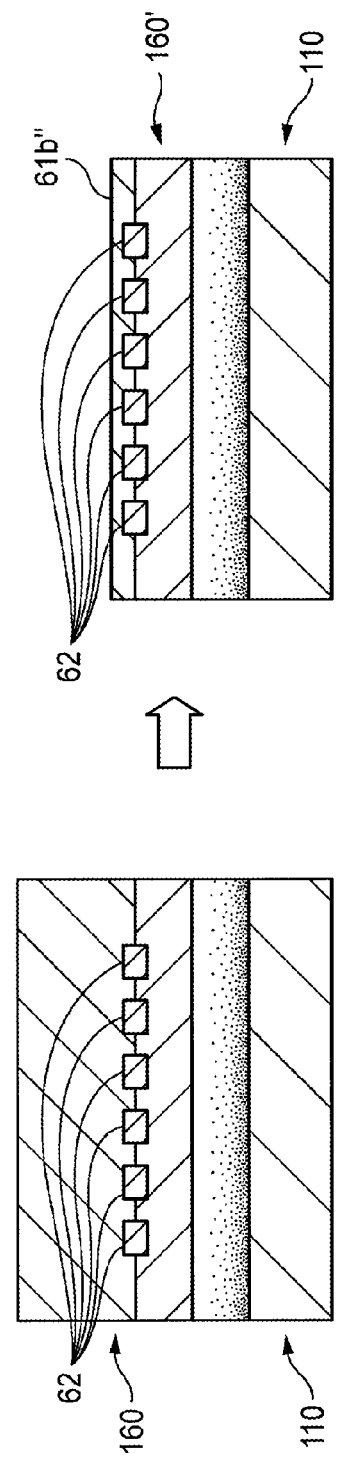
FIG. 6A
FIG. 6B

US 9,177,921 B2

MANUFACTURING METHOD OF SEMICONDUCTOR DEVICE

CROSS REFERENCE TO RELATED APPLICATION

This is a continuation of International Application No. PCT/JP2013/056379 filed on Mar. 1, 2013, and claims priority from Japanese Patent Application No. 2012-046856 filed on Mar. 2, 2012 and Japanese Patent Application No. 2012-134188 filed on Jun. 13, 2012, the entire disclosures of which are incorporated herein by reference.

TECHNICAL FIELD

The present invention relates to a manufacturing method of a semiconductor device.

BACKGROUND ART

Conventionally, in the process of producing a semiconductor device such as IC and LSI, a number of IC chips are usually formed on a semiconductor silicon wafer and individualized by dicing.

In response to needs for more size reduction and higher performance of an electronic device, the IC chip mounted in an electronic device is also required to satisfy more size reduction and higher density packaging, but the high density packaging of integrated circuits in the surface direction of a silicon substrate is reaching the near limit.

As to the method for establishing an electrical connection from an integrated circuit within an IC chip to an external terminal of the IC chip, a wire bonding method has been heretofore widely known, but in order to realize size reduction of an IC chip, a method of providing a through hole in a silicon substrate so that a metal plug as an external terminal can be passed through the through hole and thereby connected to an integrated circuit (a method of forming a so-called through-silicon via (TSV)) is recently known. However, only with the method of forming a through-silicon via, the recent needs for higher density packaging in an IC chip cannot be sufficiently responded.

In consideration of these things, a technique of fabricating multilayer integrated circuits within an IC chip and thereby increasing the integration degree per unit area of a silicon substrate is known. However, fabrication of multilayer integrated circuits increases the thickness of the IC chip, and thinning of a member constituting the IC chip is required. As to such thinning of a member, for example, thinning of a silicon substrate is being studied and this not only leads to size reduction of an IC chip but also enables labor saving in the step of forming a through hole in a silicon substrate at the production of a through-silicon via and therefore, is promising.

A wafer having a thickness of approximately from 700 to 900 μm is widely known as the semiconductor silicon wafer used in the process of producing a semiconductor device, but in recent years, for the purpose of achieving, for example, size reduction of an IC chip, an attempt is being made to reduce the thickness of the semiconductor silicon wafer to 200 μm or less.

However, the semiconductor silicon wafer having a thickness of 200 μm or less is very thin and in turn, a member for the production of a semiconductor device, which uses this wafer as the base material, is very thin, making it difficult to stably support the member without a damage, for example, when applying a further treatment to the member or merely moving the member.

In order to solve such a problem, there is known a technique of temporarily adhering an unthinned semiconductor wafer having provided on the surface a device to a supporting substrate for processing with a pressure-sensitive adhesive, grinding the back surface of the semiconductor wafer to achieve thinning, perforating the semiconductor wafer, providing a through-silicon via, and thereafter detaching the supporting substrate for processing from the semiconductor wafer (see, JP-A-2011-119427 (the term "JP-A" as used herein means an "unexamined published Japanese patent application")). It suggested that according to this technique, all of grinding resistance at the back surface grinding of semiconductor wafer, heat resistance in an anisotropic dry etching step or the like, chemical resistance at the plating or etching, smooth separation from the final supporting substrate for processing, and low contamination for adherend can be satisfied at the same time.

As to the method for supporting a wafer, there is known a method of supporting a wafer by a supporting layer system, where a plasma polymer layer obtained by a plasma deposition method is caused to intervene as a separating layer between the wafer and the supporting layer and the adhesive bonding between the supporting layer system and the separating layer is larger than the joint bonding between the wafer and the separating layer to allow for easy detachment of the wafer from the separating layer when detaching the wafer from the supporting layer system (see, JP-T-2009-528688 (the term "JP-T" as used herein means a published Japanese translation of a PCT patent application)).

SUMMARY OF INVENTION

In the case where a semiconductor wafer surface provided with a device (that is, the device surface of the device wafer) is temporarily adhered (temporarily bonded) to a supporting substrate (carrier substrate) through a layer composed of a pressure-sensitive adhesive known in JP-A-2011-119427 or the like, a certain high degree of tackiness is required of the pressure-sensitive adhesive layer so as to stably support the semiconductor wafer.

Therefore, in the case of temporarily adhering the entire device surface of the semiconductor wafer to the supporting substrate through a pressure-sensitive adhesive layer, as the temporary adhesion of the semiconductor wafer to the supporting substrate is made stronger so as to stably support the semiconductor wafer without causing damage, there is more readily caused a trouble that due to excessively strong temporary adhesion between the semiconductor wafer and the supporting substrate, at the time of detaching the semiconductor wafer from the supporting substrate, the device is damaged or the device is detached from the semiconductor wafer.

Also, the method where, as in JP-T-2009-528688, a plasma polymer layer is formed as a separating layer between a wafer and a supporting layer system by a plasma deposition method so as to prevent excessively strong adhesion of the wafer to the supporting layer system, has a problem, for example, that (1) the cost of equipment for implementing a plasma deposition method is usually high; (2) layer formation by a plasma deposition method requires a long time for vacuumization in the plasma apparatus or deposition of monomers; and (3) even when a separating layer composed of a plasma polymer layer is provided, it is not easy to control the adhesive bonding to be sufficiently high between the wafer and the separating layer when supporting the wafer subjected to processing but on the other hand, be low enough to allow for easy detachment of the wafer from the separating layer when releasing the support for the wafer.

Under these circumstances, the present invention has been made, and an object of the present invention is to provide a manufacturing method of a semiconductor device, ensuring that a to-be-treated member (such as semiconductor wafer) can be temporarily supported in a reliable and easy manner when applying a mechanical or chemical treatment to the to-be-treated member and at the same time, the temporary support for the treated member can be easily released without damaging the treated member.

As a result of intensive studies to attain the above-described object, the present inventors have accomplished the present invention. That is, the present invention is as follows.

A method for manufacturing a semiconductor device with a treated member, comprising:

subjecting an adhesive support having a substrate and an adhesive layer capable of increasing or decreasing in the adhesiveness upon irradiation with an actinic ray, radiation or heat to irradiation of the adhesive layer with the actinic ray, radiation or heat, adhering a first surface of a to-be-treated member to the adhesive layer of the adhesive support, applying a mechanical or chemical treatment to a second surface different from the first surface of the to-be-treated member to obtain a treated member, and detaching a first surface of the treated member from the adhesive layer of the adhesive support, wherein the adhesive layer is irradiated with the actinic ray, radiation or heat such that the adhesiveness decreases toward the outer surface from the inner surface on the substrate side of the adhesive layer.

In the case of applying a mechanical or chemical treatment to a to-be-treated member, the to-be-treated member must be stably supported so as to perform the desired treatment. Therefore, the adhesive force between the to-be-treated member and the adhesive support must be strong to such an extent as can withstand the treatment, albeit temporary adhesion.

On the other hand, if the adhesive force between the to-be-treated member and the adhesive support is too strong, the treated member can be hardly detached from the adhesive support or a trouble such as damage to the treated member is likely to occur.

In this way, the adhesive force between the to-be-treated member and the adhesive support is required to satisfy the delicate balance.

According to the configuration of the present invention, the adhesive layer is irradiated with an actinic ray, radiation or heat such that the adhesiveness decreases toward the outer surface from the inner surface on the substrate side of the adhesive layer. Such an adhesive layer can be easily formed by controlling the irradiation dose of actinic ray, radiation or heat to such an irradiation dose that the adhesive layer surface on the light source or heat source side is sufficiently irradiated with an actinic ray, radiation or heat but the actinic ray, radiation or heat is kept from reaching the adhesive layer surface opposite the surface on the light source or heat source side.

Such a change in the irradiation dose can be easily achieved by changing the setting of an exposure machine or a heating device, so that not only the cost of equipment can be reduced but also formation of the above-described adhesive layer can be freed from spending a long time.

Also, in the present invention, an adhesive layer which is integral as a structure but is positively caused to have a lower adhesiveness on the outer surface than the adhesiveness on the inner surface, is formed by combining the adhesive layer and the irradiation method above and therefore, another layer such as separating layer need not be provided.

In this way, formation of the above-described adhesive layer is facilitated.

Furthermore, each of the adhesiveness on the outer surface and the adhesiveness on the inner surface of the adhesive layer can be controlled with good precision, for example, by selecting the material constituting the adhesive layer and adjusting the irradiation dose of the actinic ray, radiation or heat.

As a result, the adhesiveness of the adhesive layer to each of the substrate and the to-be-treated member can be easily controlled with high precision to such a degree of adhesiveness that the to-be-treated member can be temporarily supported in a reliable manner and at the same time, the temporary support for the treated member can be easily released without damaging the treated member.

For these reasons, the manufacturing method of a semiconductor device can ensure that a to-be-treated member can be temporarily supported in a reliable and easy manner when applying a mechanical or chemical treatment to the to-be-treated member and at the same time, the temporary support for the treated member can be easily released without damaging the treated member.

According to the present invention, a manufacturing method of a semiconductor device, ensuring that a to-be-treated member can be temporarily supported in a reliable and easy manner when applying a mechanical or chemical treatment to the to-be-treated member and at the same time, the temporary support for the treated member can be easily released without damaging the treated member, can be provided.

BRIEF DESCRIPTION OF DRAWING

FIG. 4 is a schematic cross-sectional view explaining release of the temporarily adhered state between a conventional adhesive support and a device wafer.

FIGS. 6A and 6B are, respectively, a schematic cross-sectional view explaining the thinned state of a device wafer temporarily adhered by the adhesive support, and a schematic cross-sectional view explaining the thinned state of a protective layer-attached device wafer temporarily adhered by the adhesive support.

Figure 1A:
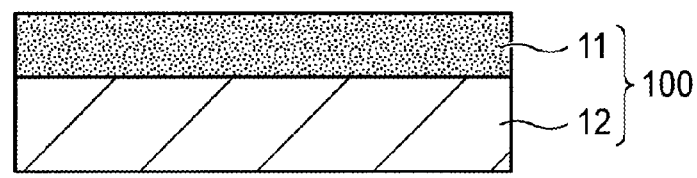
FIG. 1A is a schematic cross-sectional view showing the adhesive support used in the embodiment of the present invention.

DESCRIPTION OF REFERENCE NUMERALS AND SIGNS 1, 2: Wafer
11, 11', 21, 31: Adhesive layer
12: Carrier substrate
21A, 31A: Low adhesive region
21B, 31B: High adhesive region
50: Actinic ray, radiation or heat
51: Heat
60: Device wafer
60': Thin device wafer
61, 61': Silicon substrate
62: Device chip
63: Bump
70: Tape
80: Protective layer
100, 100', 110, 120: Adhesive support
160: Protective layer-attached device wafer

DESCRIPTION OF EMBODIMENTS

The embodiments of the present invention are described in detail below based on the drawings.

In the description of the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam (EB). Also, in the present invention, the "light" means an actinic ray or radiation.

In the description of the present invention, unless otherwise indicated, the "exposure" encompasses not only exposure to a mercury lamp, a far ultraviolet ray typified by excimer laser, an X-ray, EUV light or the like but also lithography with a particle beam such as electron beam and ion beam.

Incidentally, in the embodiments described below, the member and the like described in the drawings already referred to are indicated by the same or like symbols in the figure and their description is simplified or omitted.

Figure 1B:
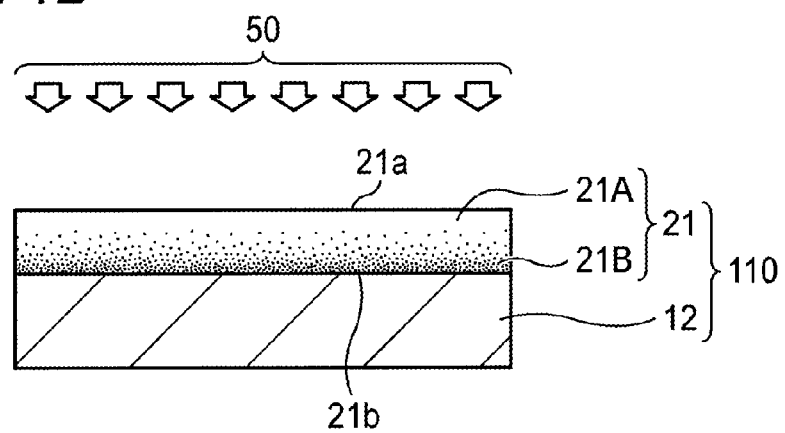
FIGS. 1B and 1C are, respectively, a schematic cross-sectional view explaining irradiation of the adhesive support with an actinic ray, radiation or heat and a schematic cross-sectional view explaining irradiation of the adhesive support with heat, in the embodiment of the present invention.
Figure 1C:
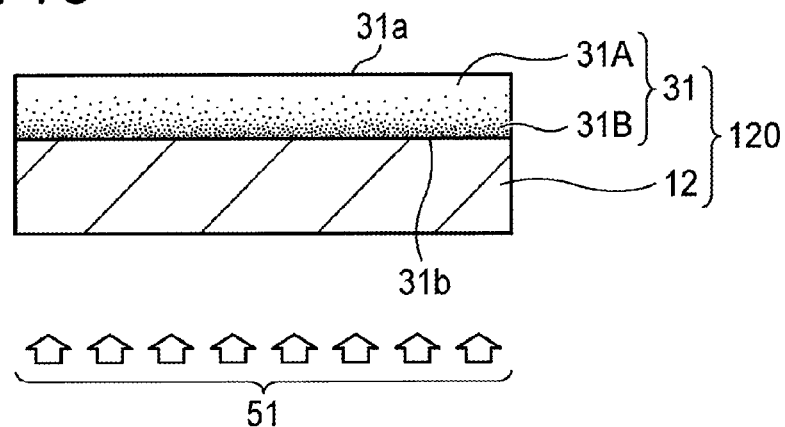

FIG. 1A is a schematic cross-sectional view showing the adhesive support used in the embodiment of the present invention, and FIGS. 1B and 1C are, respectively, a schematic cross-sectional view explaining irradiation of the adhesive support with an actinic ray, radiation or heat and a schematic cross-sectional view explaining the irradiation of the adhesive support with heat.

In the embodiment of the present invention, as shown in FIG. 1A, an adhesive support 100 obtained by providing an adhesive layer 11 on a carrier substrate 12 is first prepared.

The material for the carrier substrate 12 is not particularly limited, and examples thereof include a silicon substrate, a glass substrate, and a metal substrate. From the standpoint of causing less contamination of a silicon substrate that is typically used as the substrate of a semiconductor device or allowing use of an electrostatic chuck employed for general-purpose applications in the manufacturing step of a semiconductor device, the substrate is preferably a silicon substrate.

The thickness of the carrier substrate 12 is, for example, from 300 μM to 5 mm but is not particularly limited.

The adhesive layer 11 is an adhesive layer capable of decreasing in the adhesiveness upon irradiation with an actinic ray, radiation or heat. Specifically, the adhesive layer 11 is a layer having adhesiveness before being irradiated with an actinic ray, radiation or heat but is a layer capable of decreasing in or losing the adhesiveness upon irradiation with an actinic ray or radiation.

The adhesive layer 11 can be formed by coating an adhesive composition containing an adhesive capable of decreasing in the adhesiveness upon irradiation with an actinic ray, radiation or heat and a solvent on the carrier substrate 12 by using, for example, a conventionally known spin coating method, spraying method, roller coating method, flow coating method, doctor coating method or dipping method, and drying it.

The thickness of the adhesive layer 11 is, for example, from 1 to 500 μm but is not particularly limited.

As for the adhesive capable of decreasing in the adhesiveness upon irradiation with an actinic ray or radiation, a known adhesive described, for example, in JP-A-2004-091738 can be used.

As for the adhesive capable of decreasing in the adhesiveness upon irradiation with heat, a known adhesive described, for example, in JP-A-2003-147282 can be used.

For the solvent, known solvents can be used without limitation as long as the adhesive layer can be formed.

The adhesive composition may contain, if desired, optional components such as photopolymerization initiator, thermal polymerization initiator, release agent, surfactant, antioxidant and plasticizer, in addition to the adhesive and the solvent.

The adhesive composition which can form the adhesive layer 11 (that is, the adhesive layer capable of decreasing in the adhesiveness upon irradiation with an actinic ray or radiation) is described in detail later.

Subsequently, irradiation with an actinic ray, radiation or heat 50 is applied toward the outer surface of the adhesive layer 11, whereby, as shown in FIG. 1B, the adhesive layer 11 is converted into an adhesive layer 21 where the adhesiveness is decreased toward the outer surface 21a from the inner surface 21b on the substrate side.

As a result, the adhesive layer 21 comes to have a low adhesive region 21A on the outer surface 21a side and a high adhesive region 21B on the inner surface 21b side.

Such an adhesive layer 21 can be easily formed by controlling the irradiation dose of the actinic ray, radiation or heat 50 to such an irradiation dose that the outer surface 21a is sufficiently irradiated with the actinic ray, radiation or heat 50 but the actinic ray, radiation or heat 50 is kept from reaching the inner surface 21b.

The "low adhesive region" as used in the description of the present invention means a region having low adhesiveness as compared with the "high adhesive region". Similarly, the "high adhesive region" means a region having high adhesiveness as compared with the "low adhesive region".

It may be also possible that the adhesive layer 11 is an adhesive layer capable of increasing in the adhesiveness upon irradiation with heat and, as shown in FIG. 1C, irradiation with heat 51 is applied toward the inner surface of the adhesive layer 11 through the carrier substrate 12, thereby converting the adhesive layer 11 into an adhesive layer 31 where the adhesiveness is decreased toward the outer surface 31a from the inner surface 31b on the substrate side.

In this case, the adhesive layer 11 capable of increasing in the adhesiveness upon irradiation with heat is a layer having substantially no adhesiveness or low adhesiveness before being irradiated with heat but is a layer capable of increasing the adhesiveness in the region irradiated with heat.

As the adhesive capable of increasing in the adhesiveness upon irradiation with heat, a known adhesive can be used.

An adhesive composition containing such an adhesive, a solvent and the above-described optional components which are used, if desired, is coated on a carrier substrate 12 and then dried, whereby an adhesive layer 11 capable of increasing in the adhesiveness upon irradiation with heat can be formed.

Also in this embodiment, the adhesive layer 31 comes to have a low adhesive region 31A on the outer surface 31a side and a high adhesive region 31B on the inner surface 31b side.

Such an adhesive layer 31 can be easily formed by controlling the irradiation dose of the heat 51 to such an irradiation dose that the inner surface 31b is sufficiently irradiated with the heat 51 but the heat 51 is kept from reaching the outer surface 31a.

In the embodiment of the present invention, both the adhesive support 110 obtained by providing the adhesive layer 21 on the carrier substrate 12 and the adhesive support 120 obtained by providing the adhesive layer 31 on the carrier substrate 12 may be suitably used, but the following steps are described by using the adhesive support 110.

Temporary adhesion of the adhesive support obtained as above to a device wafer, thinning of the device wafer, and detachment of the device wafer from the adhesive support are described in detail below.

Figure 2A:
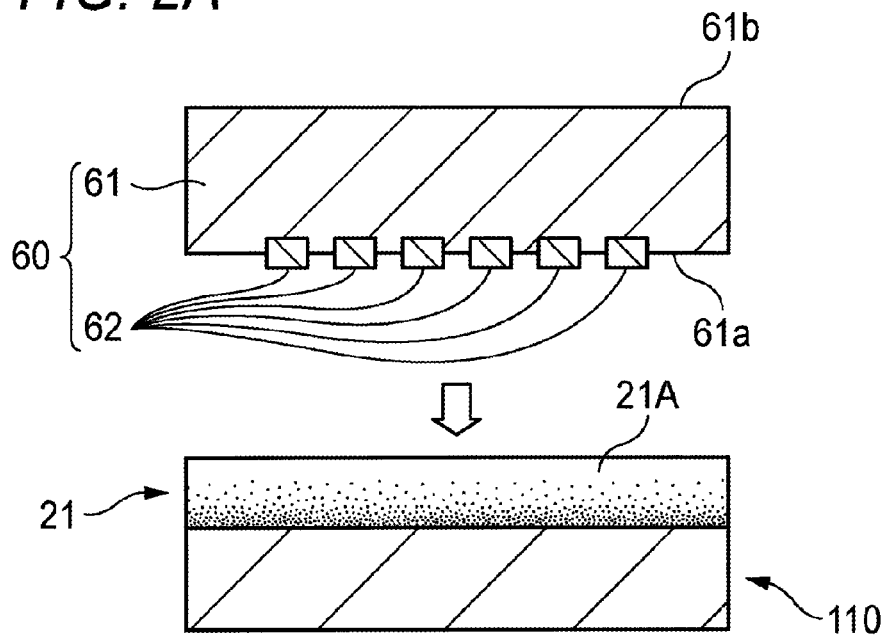
FIGS. 2A and 2B are, respectively, a schematic cross-sectional view explaining temporary adhesion of the adhesive support to a device wafer and a schematic cross-sectional view showing the thinned state of the device wafer temporarily adhered by the adhesive support.
Figure 2B:
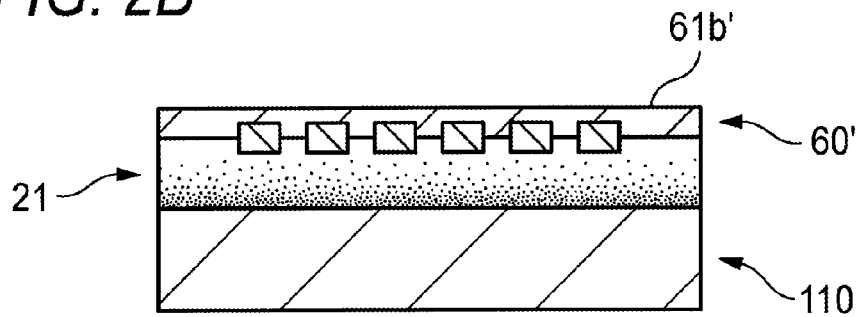

FIGS. 2A and 2B are, respectively, a schematic cross-sectional view explaining temporary adhesion of the adhesive support to a device wafer and a schematic cross-sectional view showing the thinned state of the device wafer temporarily adhered by the adhesive support.

Figure 3A:
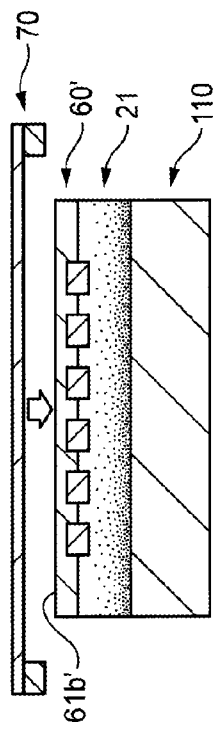
FIGS. 3A, 3B and 3C are, respectively, a schematic cross-sectional view explaining a step of attaching a tape to a thin device wafer, a schematic cross-sectional view explaining a step of sliding the thin device wafer with respect to the adhesive support, and a schematic cross-sectional view explaining a step of separating the thin device wafer from the adhesive support.
Figure 3C:
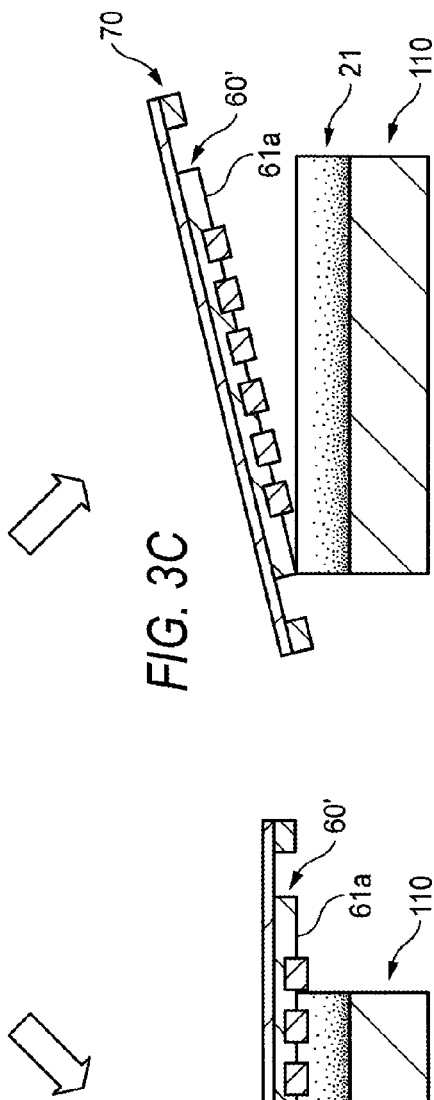
Figure 3B:
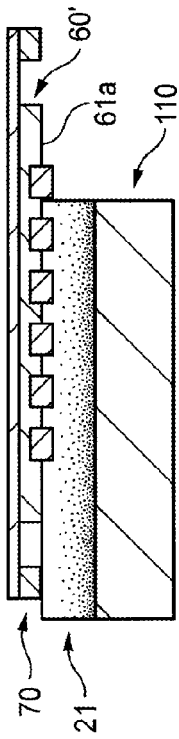

FIGS. 3A, 3B and 3C are, respectively, a schematic cross-sectional view explaining a step of attaching a tape to a thin device wafer, a schematic cross-sectional view explaining a step of sliding the thin device wafer with respect to the adhesive support, and a schematic cross-sectional view explaining a step of separating the thin device wafer from the adhesive support.

As shown in FIG. 2A, a device wafer 60 (to-be-treated member) is obtained by providing a plurality of device chips 62 on a surface 61a of a silicon substrate 61.

Here, the thickness of the silicon substrate 61 is, for example, from 200 to 1,200 μm.

The surface 61a of the silicon substrate 61 is pressed against an adhesive layer 21 of an adhesive support 110, whereby the surface 61a of the silicon substrate 61 adheres to a low adhesive region 21A of the adhesive layer 21 to establish temporary adhesion of the adhesive support 110 to the device wafer 60.

If desired, the adhesion assembly of the adhesive support 110 and the device wafer 60 may be thereafter heated to increase the adhesiveness.

Subsequently, a mechanical or chemical treatment, specifically, a thinning treatment such as grinding or chemical-mechanical polishing (CMP), is applied to the back surface 61b of the silicon substrate 61, whereby the thickness of the silicon substrate 61 is reduced (for example, to a thickness of 1 to 200 μm), as shown in FIG. 2B, to obtain a thin device wafer 60'.

As the mechanical or chemical treatment, a treatment of forming a through hole (not shown) penetrating the silicon substrate from the back surface 61b' of the thin device wafer 60' and further forming a through-silicon via (not shown) in the through hole may be performed, if desired, after the thinning treatment.

Subsequently, a tape (for example, a dicing tape) 70 is attached to the back surface 61b' of the thin device wafer 60' as shown in FIG. 3A, and the thin device wafer 60' is slid with respect to the adhesive support 110 as shown in FIG. 3B or the thin device wafer 60' is separated from the adhesive support 110 as shown in FIG. 3C, whereby the surface 61a of the thin device wafer 60' is detached from the adhesive layer 21 of the adhesive support 110.

If desired, various known treatments are thereafter applied to the thin device wafer 60' to manufacture a semiconductor device having a thin device wafer 60'.

A conventional embodiment is described below.

FIG. 4 is a schematic cross-sectional view explaining release of the temporarily adhered state between a conventional adhesive support and a device wafer.

In the conventional embodiment, as shown in FIG. 4, temporary adhesion of the adhesive support 100' to a device wafer and a thinning treatment of the silicon substrate in the device wafer are performed by the same procedure as that described with reference to FIGS. 2A and 2B except for using, as the adhesive support, an adhesive support 100' obtained by providing a normal adhesive layer 11' with no photosensitivity on a carrier substrate 12, and a thin device wafer 60' is separated from the adhesive support 100' by the same procedure as that described with reference to FIGS. 3A and 3C.

However, as the temporary adhesion of the device wafer to the carrier substrate is made stronger so as to stably support the semiconductor wafer without causing damage, there is more readily caused a trouble that due to excessively strong temporary adhesion between the device wafer and the carrier substrate, at the time of detaching the thin device wafer 60' from the carrier substrate 100' as shown in FIG. 4, a device chip 62 having provided thereon a bump 63 is damaged, for example, resulting from detachment of the bump 63 from the device chip 62.

On the other hand, in the above-described embodiment of the present invention, both the adhesive support 110 and the adhesive support 120 have a configuration where the adhesive layer 21 or 31 has a low adhesive region 21A or 31A on the outer surface 21a ore 31a side and a high adhesive region 21B or 31B on the inner surface 21b or 31b side.

Such an adhesive layer 21 or 31 can be easily formed, as described above, by controlling the irradiation dose of actinic ray, radiation or heat to such an irradiation dose that the adhesive layer surface on the light source or heat source side is sufficiently irradiated with an actinic ray, radiation or heat but the actinic ray, radiation or heat is kept from reaching the adhesive layer surface opposite the surface on the light source or heat source side.

This change in the irradiation dose can be easily achieved by changing the setting of an exposure machine or a heating device, so that not only the cost of equipment can be reduced but also formation of the adhesive layer 21 or 31 can be freed from spending a long time.

Also, in the above-described embodiment of the present invention, an adhesive layer 21 or 31 which is integral as a structure but is positively caused to have lower adhesiveness on the outer surface 21a or 31a than the adhesiveness on the inner surface 21b or 31b, is formed by combining the adhesive layer 11 and the irradiation method above and therefore, another layer such as separating layer need not be provided.

In this way, formation of the adhesive layer 21 or 31 is facilitated.

Furthermore, each of the adhesiveness on the outer surface 21*a* or 31*a* and the adhesiveness on the inner surface 21*b* or 31*b* can be controlled with good precision, for example, by selecting the material constituting the adhesive layer 11 and adjusting the irradiation dose of the actinic ray, radiation or heat.

As a result, the adhesiveness of the adhesive layer 21 or 31 to each of the substrate 12 and the silicon substrate 61 can be easily controlled with high precision to such a degree of adhesiveness that the silicon substrate 61 of the device wafer 60 can be temporarily supported in a reliable manner and at the same time, the temporary support for the silicon substrate of the thin device wafer 60' can be easily released without damaging the thin device wafer 60'.

For these reasons, according to the embodiment of the present invention, the silicon substrate 61 can be temporarily supported in a reliable and easy manner when applying the above-described treatment to the silicon substrate 61 of the device wafer 60 and at the same time, the temporary support for the thin device wafer 60' can be easily released without damaging the thin device wafer 60'.

FIGS. 5A, 5B, 5C and 5D are, respectively, a schematic cross-sectional view explaining temporary adhesion of the adhesive support to a protective layer-attached device wafer, a schematic cross-sectional view showing the thinned state of the protective layer-attached device wafer temporarily adhered by the adhesive support, a schematic cross-sectional view showing the protective layer-attached thin device wafer separated from the adhesive support, and a schematic cross-sectional view showing the thin device wafer.

FIGS. 6A and 6B are, respectively, a schematic cross-sectional view explaining the thinned state of a device wafer temporarily adhered by the adhesive support, and a schematic cross-sectional view explaining the thinned state of a protective layer-attached device wafer temporarily adhered by the adhesive support.

Figure 5A:
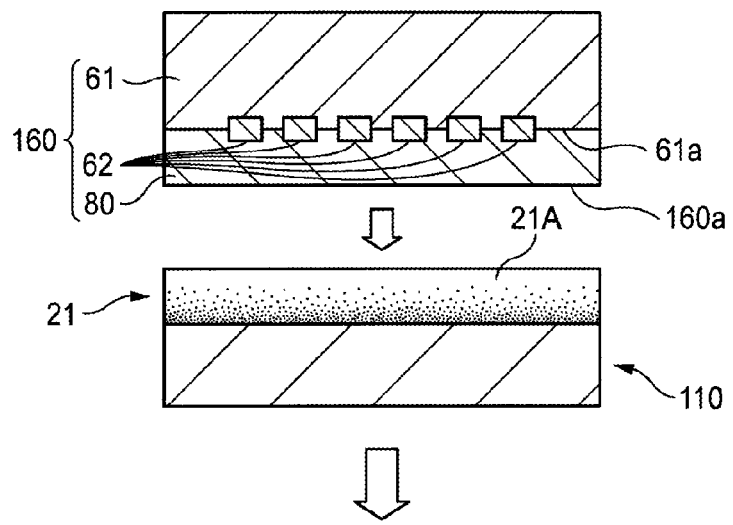
FIGS. 5A, 5B, 5C and 5D are, respectively, a schematic cross-sectional view explaining temporary adhesion of the adhesive support to a protective layer-attached device wafer, a schematic cross-sectional view showing the thinned state of the protective layer-attached device wafer temporarily adhered by the adhesive support, a schematic cross-sectional view showing the protective layer-attached thin device wafer separated from the adhesive support, and a schematic cross-sectional view showing the thin device wafer.

In the first embodiment of the present invention, as shown in FIG. 5A, a protective layer-attached device wafer 160 (to-be-treated member) may be used in place of the device wafer 60.

Here, the protective layer-attached device wafer 160 has a silicon substrate 61 (to-be-treated base material) having provided on the surface 61*a* thereof a plurality of device chips 62 and a protective layer 80 that is provided on the surface 61*a* of the silicon substrate 61 and protects the device chips 62.

The thickness of the protective layer 80 is, for example, from 1 to 1,000 µm.

For the protective layer 80, known materials may be used without limitation, but a material capable of unfailingly protecting the device chip 62 is preferred.

A surface 160*a* (a protective layer 80 surface opposite the silicon substrate 61) of the protective layer-attached device wafer 160 is pressed against an adhesive layer 21 of an adhesive support 110, whereby the surface 160*a* of the protective layer-attached device wafer 160 adheres to a low adhesive region 21A of the adhesive layer 21 to establish temporary adhesion of the adhesive support 110 to the device wafer 160.

Figure 5B:
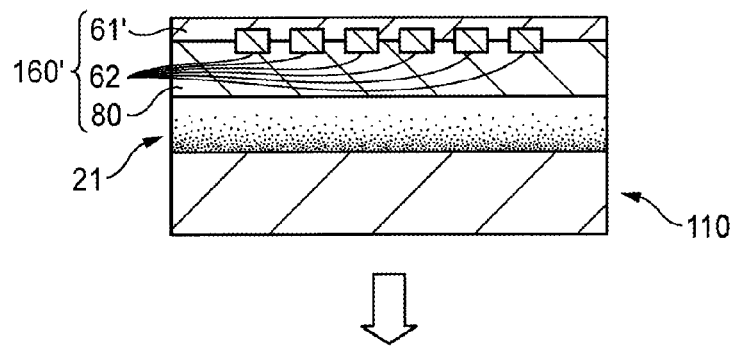

Subsequently, similarly to the above, the thickness of the silicon substrate 61 is reduced (for example, to form a silicon substrate 61' having a thickness of 1 to 200 µm) as shown in FIG. 5B to obtain a protective layer-attached thin device wafer 160'.

Figure 5C:
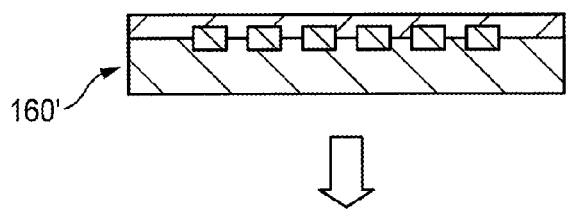

Thereafter, similarly to the above, the surface 160*a* of the protective layer-attached thin device wafer 160' is detached from the adhesive layer 21 of the adhesive support 110 to obtain a protective layer-attached thin device wafer 160' as shown in FIG. 5C.

Figure 5D:
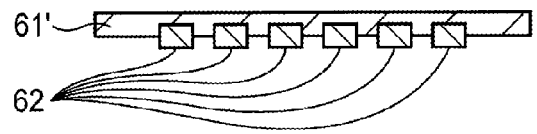

Furthermore, the protective layer 80 in the protective layer-attached thin device wafer 160' is removed from the silicon substrate 61' and the device chip 62 to obtain, as shown in FIG. 5D, a thin device wafer where device chips 62 are provided on a silicon substrate 61'.

For the removal of the protective layer 80, all known methods may be employed, but examples thereof include (1) a method of dissolving and removing the protective layer 80 with a solvent; (2) a method of attaching a release tape or the like to the protective layer 80 and mechanically separating the protective layer 80 from the silicon substrate 61' and the device chip 62; and (3) a method of subjecting the protective layer 80 to exposure to light such as ultraviolet ray and infrared ray or irradiation with a laser, thereby decomposing the protective layer 80 or increasing the releasability of the protective layer 80.

The methods (1) and (3) are advantageous in that the action of the method extends over the entire surface of the protective film and therefore, removal of the protective layer 80 is facilitated.

The method (2) is advantageous in that the method can be performed at room temperature without requiring any special apparatus.

The embodiment using, as the to-be-treated member, a protective layer-attached device wafer 160 in place of a device wafer 60 is effective when attempting to more reduce TTV (Total Thickness Variation) of a thin device wafer obtained by thinning the device wafer 60 temporarily adhered by the adhesive support 110 (that is, when attempting to more enhance the flatness of the thin device wafer).

More specifically, in the case of thinning the device wafer 60 temporarily adhered by the adhesive support 110, as shown in FIG. 6A, the uneven profile of the device wafer 60, which is created by a plurality of device chips 62, tends to be transferred to the back surface 61*b*' of the thin device wafer 60' and may work out to a TTV-increasing factor.

On the other hand, in the case of thinning the protective layer-attached device wafer 160 temporarily adhered by the adhesive support 110, as shown in FIG. 6B, a plurality of device chips 62 are protected by a protective layer and therefore, the uneven profile can be substantially eliminated on the contact surface of the protective layer-attached device wafer 160 with the adhesive support 110. Accordingly, even when such a protective layer-attached device wafer 160 is thinned in the state of being supported by the adhesive support 110, the profile attributable to a plurality of device chips 62 is less likely to be transferred to the back surface 61*b*" of the protective layer-attached thin device wafer 160', as a result, TTV of the finally obtained thin device wafer can be more reduced.

The manufacturing method of a semiconductor device of the present invention is not limited to the embodiment above but, for example, appropriate modifications or improvements may be made therein.

In the embodiments above, the adhesive layer has a single-layer structure, but the adhesive layer may have a multilayer structure. Examples of the method for forming an adhesive layer having a multilayer structure include a method of stepwise coating an adhesive composition by the above-described conventionally known method before applying irradiation with an actinic ray or radiation, and a method of coating an adhesive composition by the above-described conventionally known method after applying irradiation with an actinic ray or radiation. In the mode where the adhesive layer has a multilayer structure, for example, when the adhesive layer 11 is an adhesive layer capable of decreasing in the adhesiveness upon irradiation with an actinic ray or radiation, the adhesiveness as an entire adhesive layer can be decreased also by decreasing the adhesiveness between respective layers by irradiation with an actinic ray or radiation.

In the embodiments above, the to-be-treated member supported by the adhesive support is a silicon substrate, but the to-be-treated member is not limited thereto and may be any to-be-treated member which can be subjected to a mechanical or chemical treatment in the manufacturing method of a semiconductor device.

For example, the to-be-treated member includes a compound semiconductor substrate, and specific examples of the compound semiconductor substrate include an SiC substrate, an SiGe substrate, a ZnS substrate, a ZnSe substrate, a GaAs substrate, an InP substrate and a GaN substrate.

In the embodiments above, the mechanical or chemical treatment applied to the silicon substrate supported by the adhesive support is a thinning treatment of the silicon substrate or a treatment of forming a through-silicon via, but the mechanical or chemical treatment is not limited thereto and may be any treatment required in the manufacturing method of a semiconductor device.

In addition, the shape, dimension, number, arrangement portion and the like of light-transmitting and light-shielding regions in the mask, high and low adhesion regions in the adhesive layer, device chip in the device wafer, and tape and the like, which are exemplified in the embodiments above, are arbitrary and not limited as long as the present invention can be achieved.

The adhesive composition capable of forming the adhesive layer 11 (that is, the adhesive layer capable of decreasing in the adhesiveness upon irradiation with an actinic ray or radiation) is described in detail below.

(A) Resin

The adhesive composition preferably contains a resin (hereinafter, sometimes referred to as the resin (A)).

Examples of the resin (A) include a (meth)acrylic polymer, a polyurethane resin, a polyvinyl alcohol resin, a polyvinylbutyral resin, a polyvinylformal resin, a polyamide resin, a polyester resin, and an epoxy resin, with a (meth)acrylic polymer and a polyurethane resin being preferred.

The resin (A) is preferably a resin containing a repeating unit having a polymerizable group. The polymerizable group in the resin (A) is not particularly limited, but examples thereof include an unsaturated group (such as ethylenically unsaturated group), an epoxy group and an oxetane group, with an unsaturated group being preferred.

In this case, the polymerizable group in the resin (A) is a group capable of developing adhesiveness and at the same time, undergoing a reaction upon irradiation with an actinic ray or radiation to lose the polymerization activity and decrease the adhesiveness. That is, the resin (A) having a polymerizable group can function as the above-described "adhesive capable of decreasing in the adhesiveness upon irradiation with an actinic ray or radiation".

The content of the polymerizable group-containing repeating unit is preferably from 1 to 30 mol %, more preferably from 5 to 15 mol %, based on all repeating units in the resin (A).

The resin (A) is also preferably an alkali-soluble resin having a polymerizable group.

The alkali-soluble resin can be appropriately selected from alkali-soluble resins which are a linear organic high molecular polymer and contain at least one alkali solubility-promoting group in the molecule (preferably the molecule having an acryl-based copolymer or a styrene-based copolymer as the main chain). In view of heat resistance, the alkali-soluble resin is preferably a polyhydroxystyrene-based resin, a polysiloxane-based resin, a polyurethane resin, an acrylic resin, an acrylamide-based resin or an acryl/acrylamide copolymer resin.

Examples of the alkali solubility-promoting group (hereinafter, sometimes referred to as "acid group") include a carboxyl group, a phosphoric acid group, a sulfonic acid group, and a phenolic hydroxyl group, and a (meth)acryloyl group is particularly preferred. Only one of these acid groups may be used, or two or more thereof may be used.

The alkali-soluble resin may be obtained, for example, by polymerizing, as a monomer component, an acid group-containing monomer and/or a monomer capable of imparting an acid group after polymerization (hereinafter, sometimes referred to as "monomer for acid group introduction").

Incidentally, in the case of introducing an acid group by using, as a monomer component, a monomer capable of imparting an acid group after polymerization, for example, the later-described treatment for imparting an acid group is required after polymerization.

Examples of the acid group-containing monomer include a carboxyl group-containing monomer such as (meth)acrylic acid and itaconic acid, a phenolic hydroxyl group-containing monomer such as N-hydroxyphenylmaleimide, and a carboxylic anhydride group-containing monomer such as maleic anhydride and itaconic anhydride. Among these, a (meth)acrylic acid is preferred.

Examples of the monomer capable of imparting an acid group after polymerization include a hydroxyl group-containing monomer such as 2-hydroxyethyl (meth)acrylate, an epoxy group-containing monomer such as glycidyl (meth)acrylate, and an isocyanate group-containing monomer such as 2-isocyanatoethyl (meth)acrylate. Only one of these monomers for acid group introduction may be used, or two or more thereof may be used.

In the case of using a monomer capable of imparting an acid group after polymerization, the treatment for imparting an acid group includes a treatment of modifying a part of polar groups in the polymer side chain by a polymer reaction.

The linear organic high molecular polymer used as the alkali-soluble resin is preferably a polymer having a carboxylic acid in the side chain, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as novolak resin, an acidic cellulose derivative having a carboxylic acid in the side chain, and a resin obtained by adding an acid anhydride to a polymer having a hydroxyl group. In particular, a copolymer of a (meth)acrylic acid and another monomer copolymerizable therewith is suitable as the alkali-soluble resin. The another monomer copolymerizable with a (meth)acrylic acid includes, for example, an alkyl (meth)acrylate, an aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and an N-substituted maleimide monomer described in JP-A-10-300922, such as N-phenylmaleimide and N-cyclohexylmaleimide. As for the another monomer copolymerizable with the (meth)acrylic acid, only one kind of a monomer may be used, or two or more kinds of monomers may be used.

The alkali-soluble resin is also preferably (a) a polymer obtained by polymerizing a monomer component mandatorily containing a compound represented by the following formula (ED) (hereinafter, sometimes referred to as "ether dimer"). Thanks to this polymer, the adhesive composition of the present invention can form an adhesive layer very excellent in the transparency as well as in the heat resistance.

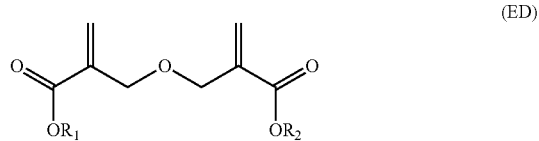

(ED)

(In formula (ED), each of $R_1$ and $R_2$ independently represents a hydrogen atom or a hydrocarbon group having a carbon number of 1 to 25, which may have a substituent.)

In formula (ED) showing an ether dimer, the hydrocarbon group represented by $R_1$ and $R_2$ having a carbon number of 1 to 25, which may have a substituent, is not particularly limited, but examples thereof include a linear or branched alkyl group such as methyl, ethyl, n-propyl, isopropyl, n-butyl, isobutyl, tert-butyl, tert-amyl, stearyl, lauryl and 2-ethylhexyl; an aryl group such as phenyl; an alicyclic group such as cyclohexyl, tert-butylcyclohexyl, dicyclopentadienyl, tricyclodecanyl, isobornyl, adamantyl and 2-methyl-2-adamantyl; an alkoxy-substituted alkyl group such as 1-methoxyethyl and 1-ethoxyethyl; and an aryl group-substituted alkyl group such as benzyl. Among these, a substituent of primary or secondary carbon, which is less likely to leave by the action of an acid or heat, such as methyl, ethyl, cyclohexyl and benzyl, is preferred in view of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(tert-butyl)-2,2'-[oxybis(methylene)bis-2-propenoate, di(tert-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, biphenyl-2,2'-[oxybis(methylene)]bis-2-propenoate, dicyclohexyl-2,2'-[oxybis(methylene)]bis-2-propenoate, di(tert-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. Only one of these ether dimers may be used, or two or more thereof may be used. An alkali-soluble resin may be also obtained by copolymerizing the compound represented by formula (ED) with another monomer.

The alkali-soluble phenol resin includes, for example, a novolak resin and a vinyl polymer.

The novolak resin includes, for example, a resin obtained by fusing phenols and aldehydes in the presence of an acid catalyst. Examples of the phenols include phenol, cresol, ethylphenol, butylphenol, xylenol, phenylphenol, catechol, resorcinol, pyrogallol, naphthol, and bisphenol A.

Examples of the aldehydes include formaldehyde, paraformaldehyde, acetaldehyde, propionaldehyde, and benzaldehyde.

One of these phenols and aldehydes may be used alone, or two or more thereof may be used in combination.

Specific examples of the novolak resin include metacresol, paracresol, and a condensation product of a mixture thereof and formalin.

The molecular weight distribution of the novolak resin may be adjusted by using fractionation or the like. Also, a low molecular weight component having a phenolic hydroxyl group such as bisphenol C and bisphenol A may be mixed with the novolak resin.

As the alkali-soluble resin, among others, a benzyl (meth)acrylate/(meth)acrylic acid copolymer and a multi-copolymer composed of benzyl (meth)acrylate/(meth)acrylic acid/another monomer are preferred. Other examples include a copolymer of 2-hydroxyethyl methacrylate; and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, which are described in JP-A-7-140654.

The acid value of the alkali-soluble resin is preferably from 30 to 200 mgKOH/g, more preferably from 50 to 150 mgKOH/g, and most preferably from 70 to 120 mgKOH/g.

The alkali-soluble resin having a polymerizable group is preferably obtained by introducing a polymerizable group into the above-described alkali-soluble resin (more preferably by incorporating a polymerizable group-containing repeating unit into the alkali-soluble resin).

As the alkali-soluble resin having a polymerizable group, for example, an alkali-soluble resin containing, in the side chain, an allyl group, a (meth)acryl group or an allyloxyalkyl group is useful. Examples of the polymer containing a polymerizable group include DIANAL NR Series (produced by Mitsubishi Rayon Co., Ltd.), Photomer 6173 (COOH-containing polyurethane acrylic oligomer, produced by Diamond Shamrock Co., Ltd.), Viscoat R-264, KS Resist 106 (both produced by Osaka Organic Chemical Industry Ltd.), CYCLOMER P Series, PLACCEL CF200 Series (all produced by Daicel Chemical Industries, Ltd.), and Ebecryl 3800 (produced by Daicel-UCB Company Ltd.). Preferred examples of the alkali-soluble resin having a polymerizable group include a urethane-modified polymerizable double bond-containing acrylic resin obtained by previously reacting an isocyanate group and an OH group while leaving one unreacted isocyanate group, and reacting a (meth)acryloyl group-containing compound and a carboxyl group-containing acrylic resin; an unsaturated group-containing acrylic resin obtained by reacting a carboxyl group-containing acrylic resin and a compound having both an epoxy group and a polymerizable double bond in the molecule; an acid pendant-type epoxy acrylate resin; a polymerizable double bond-containing acrylic resin obtained by reacting an OH group-containing acrylic resin and a polymerizable double bond-containing dibasic acid anhydride; a resin obtained by reacting an OH group-containing acrylic resin and a compound having an isocyanate and a polymerizable group; and a resin obtained by applying a basic treatment to a resin containing, in the side chain, an ester group having a leaving group such as halogen atom or sulfonate group at the α- or β-position, described in JP-A-2002-229207 and JP-A-2003-335814.

The content of the repeating unit having an alkali-soluble group (acid group) is preferably from 1 to 30 mol %, more preferably from 5 to 20 mol %, based on all repeating units in the resin (A).

In the production of the resin (A), for example, a method by a known radical polymerization process can be applied. Various polymerization conditions when producing the alkali-soluble resin by the radical polymerization process, such as temperature, pressure, kind and amount of radical initiator, and kind of solvent, can be easily set by one skilled in the art, and the conditions may be also experimentally determined.

In one preferred embodiment of the present invention, the resin is a polyurethane resin. In this case, the polyurethane resin having a carboxyl group is typically a polyurethane resin having, as a basic skeleton, a structural unit represented by a reaction product between at least one diisocyanate compound represented by the following formula (2) and at least one diol compound represented by formula (3):

$$OCN-X^0-NCO \tag{2}$$

$$HO-Y^0-OH \tag{3}$$

(wherein each of $X^0$ and $Y^0$ represents a divalent organic residue).

The diisocyanate compound is preferably a diisocyanate compound represented by the following formula (4):

$$OCN-L^1-NCO \tag{4}$$

In the formula, $L^1$ represents a divalent aliphatic or aromatic hydrocarbon group which may have a substituent. If desired, $L^1$ may have another functional group incapable of reacting with an isocyanate group, such as ester group, urethane group, amide group and ureido group.

I) Diisocyanate Compound

The diisocyanate compound represented by formula (4) specifically includes the followings:

an aromatic diisocyanate compound such as 2,4-tolylene diisocyanate, dimer of 2,4-tolyl ene diisocyanate, 2,6-tolylenedilene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound such as hexamethylene diisocyanate, trimethylhexamethylene diisocyanate, lysine diisocyanate and dimer acid diisocyanate; an alicyclic diisocyanate compound such as isophorone diisocyanate, 4,4'-methylenebis(cyclohexyl isocyanate), methylcyclohexane-2,4 (or 2,6) diisocyanate and 1,3-(isocyanatomethyl)cyclohexane; and a diisocyanate compound that is a reaction product between a diol and a diisocyanate, such as adduct of 1 mol of 1,3-butylene glycol and 2 mol of tolylene diisocyanate.

II) Diol Compound

The diol compound widely includes a polyether diol compound, a polyester diol compound, a polycarbonate diol compound, and the like.

The polyether diol compound includes compounds represented by the following formulae (5), (6), (7), (8) and (9) and a random copolymer of ethylene oxide and propylene oxide each having a hydroxyl group at the terminal.

$$HO-(CH_2CHO)_a-H \atop R^1 \tag{5}$$

$$HO-(CH_2CH_2CHO)_b-H \atop R^1 \tag{6}$$

$$HO-(CH_2CH_2CH_2CH_2O)_c-H \tag{7}$$

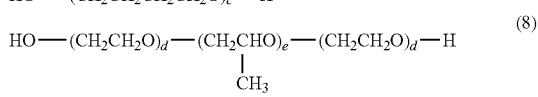
$$HO-(CH_2CH_2O)_d-(CH_2CHO)_e-(CH_2CH_2O)_d-H \atop CH_3 \tag{8}$$

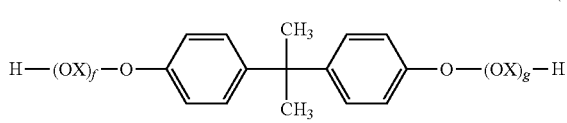
(9)

In the formulae, $R^1$ represents a hydrogen atom or a methyl group, and X represents the following group:

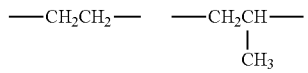
$$-CH_2CH_2- \quad -CH_2CH- \atop CH_3$$

Each of a, b, c, d, e, f and g represents an integer of 2 or more and is preferably an integer of 2 to 100.

The polyether diol compounds represented by formulae (5) and (6) specifically include the followings:

that is, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000, and polypropylene glycol having a weight average molecular weight of 4,000.

The polyether diol compound represented by formula (7) specifically includes the followings:

PTMG650, PTMG1000, PTMG2000, and PTMG3000 (trade names), produced by Sanyo Chemical Industries, Ltd.

The polyether diol compound represented by formula (8) specifically includes the followings:

NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108,

NEWPOL PE-128, and NEWPOL PE-61 (trade names), produced by Sanyo Chemical Industries, Ltd.

The polyether diol compound represented by formula (9) specifically includes the followings:

NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, and NEWPOL BPE-5P (trade names), produced by Sanyo Chemical Industries, Ltd.

The random copolymer of ethylene oxide and propylene oxide each having a hydroxyl group at the terminal include the followings:

NEWPOL 5011B-100, NEWPOL 50HB-260, NEWPOL 50HB-400, NEWPOL 50HB-660, NEWPOL 50HB-2000, and NEWPOL 50HB-5100 (trade names), produced by Sanyo Chemical Industries, Ltd.

The polyester diol compound includes compounds represented by the following formulae (10) and (11):

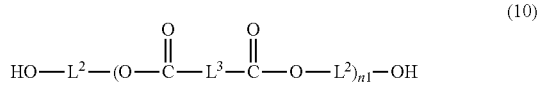

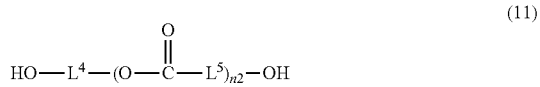

In the formulae, $L^2$, $L^3$ and $L^4$ may be the same or different and each represents a divalent aliphatic or aromatic hydrocarbon group, and $L^5$ represents a divalent aliphatic hydrocarbon group. Preferably, each of $L^2$, $L^3$ and $L^4$ represents an alkylene group, an alkenylene group, an alkynylene group or an arylene group, and $L^5$ represents an alkylene group. Also, in $L^2$, $L^3$, $L^4$ and $L^5$, another functional group incapable of reacting with an isocyanate group, such as ether group, carbonyl group, ester group, cyano group, olefin group, urethane group, amido group, ureido group and halogen atom, may be present. Each of n1 and n2 is an integer of 2 or more, preferably an integer of 2 to 100.

The polycarbonate diol compound includes a compound represented by formula (12):

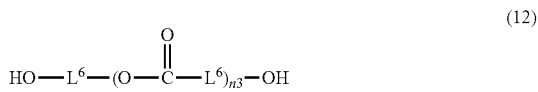

In the formula, $L^6$s may be the same or different and each represents a divalent aliphatic or aromatic hydrocarbon group. $L^6$ preferably represents an alkylene group, an alkenylene group, an alkynylene group or an arylene group. Also, in $L^6$, another functional group incapable of reacting with an isocyanate group, such as ether group, carbonyl group, ester group, cyano group, olefin group, urethane group, amido group, ureido group and halogen atom, may be present. n3 is an integer of 2 or more, preferably an integer of 2 to 100.

The diol compounds represented by formulae (10), (11) and (12) specifically include (Compound No. 1) to (Compound No. 18) illustrated below. In specific examples, n is an integer of 2 or more.

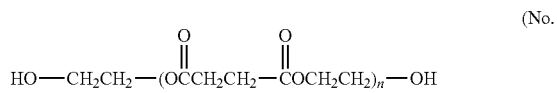

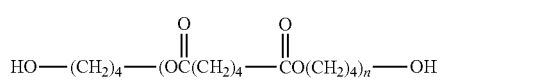

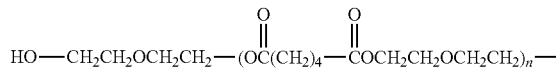

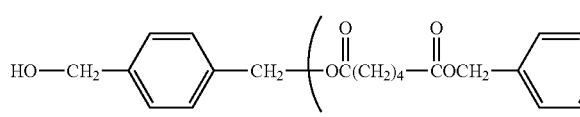

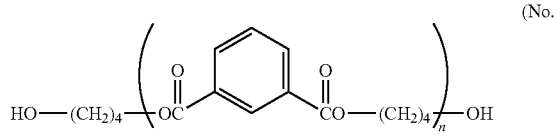

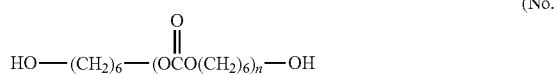

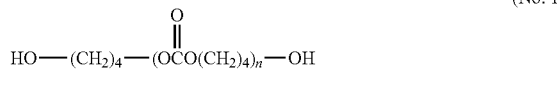

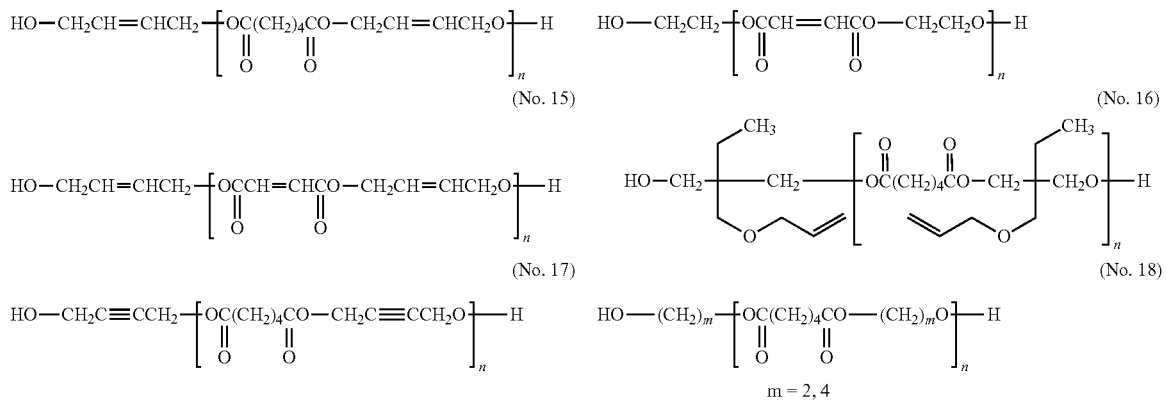

In the case where the polyurethane resin corresponds to the above-described alkali-soluble resin, the polyurethane is preferably a polyurethane resin having a carboxyl group as the acid group.

The polyurethane resin having a carboxyl group includes a polyurethane resin having a structural unit represented by at least one of diol compounds of formulae (13), (14) and (15) and/or a structural unit derived from a compound obtained by ring-opening a tetracarboxylic dianhydride by a diol compound.

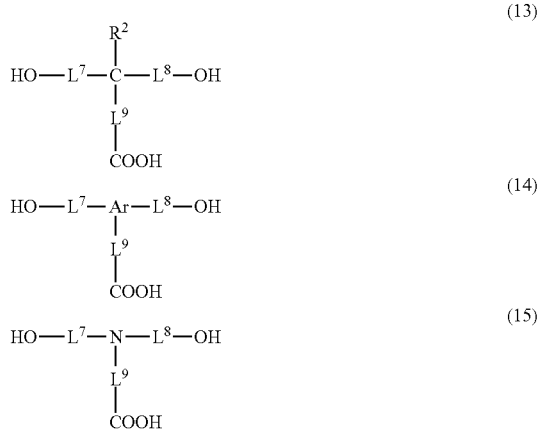

In the formulae, $R^2$ represents a hydrogen atom, an alkyl group which may have a substituent (for example, a cyano group, a nitro group, a halogen atom such as —F, —Cl, —Br and —I, or a group of —$CONH_2$, —$COOR^3$, —$OR^3$, —NH-$CONHR^3$, —$NHCOOR^3$, —$NHCOR^3$ or —$OCONHR^3$ (wherein $R^3$ represents an alkyl group having a carbon number of 1 to 10 or an aralkyl group having a carbon number of 7 to 15)), an aralkyl group, an aryl group, an alkoxy group, or an aryloxy group, preferably represents a hydrogen atom, an alkyl group having a carbon number of 1 to 8 or an aryl group having a carbon number of 6 to 15. $L^7$, $L^8$ and $L^9$ may be the same or different and each represents a single bond, or a divalent aliphatic or aromatic hydrocarbon group which may have a substituent (preferably, for example, an alkyl group, an aralkyl group, an aryl group, an alkoxy group or a halogeno group), preferably represents an alkylene group having a carbon number of 1 to 20 or an arylene group having a carbon number of 6 to 15, and more preferably represents an alkylene group having a carbon number of 1 to 8. If desired, each of $L^7$, $L^8$ and $L^9$ may have another functional group incapable of reacting with an isocyanate group, such as carbonyl group, ester group, urethane group, amido group, ureido group and ether group. Incidentally, two or three members out of $R^2$, $L^7$, $L^8$ and $L^9$ may form a ring.

Ar represents a trivalent aromatic hydrocarbon group which may have a substituent, and preferably represents an aromatic group having a carbon number of 6 to 15.

III) Carboxyl Group-Containing Diol Compound

The carboxyl group-containing diol compounds represented by formulae (13) (14) and (15) specifically include the followings:

that is, 3,5-dihydroxybenzoic acid, 2,2-bis(hydroxymethyl)propionic acid, 2,2-bis(2-hydroxyethyl)propionic acid, 2,2-bis(3-hydroxypropyl)propionic aid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamide.

In the present invention, preferred tetracarboxylic dianhydrides used for synthesis of the carboxyl group-containing polyurethane resin include those represented by formulae (16), (17) and (18):

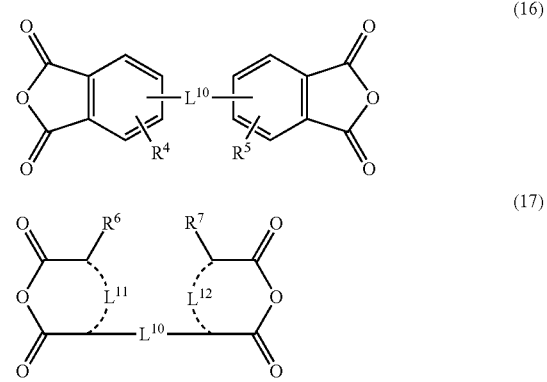

(18)

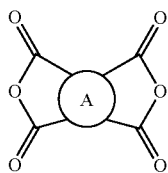

In the formulae, $L^{10}$ represents a single bond, a divalent aliphatic or aromatic hydrocarbon group which may have a substituent (preferably, for example, an alkyl group, an aralkyl group, an aryl group, an alkoxy group, a halogeno group, an ester group or an amido group), —CO—, —SO—, —SO$_2$—, —O— or —S—, preferably represents a single bond, a divalent aliphatic hydrocarbon group having a carbon number of 1 to 15, —CO—, —SO$_2$—, —O— or —S—. $R^4$ and $R^5$ may be the same or different and each represents a hydrogen atom, an alkyl group, an aralkyl group, an aryl group, an alkoxy group or a halogeno group, and preferably represents a hydrogen atom, an alkyl group having a carbon number of 1 to 8, an aryl group having a carbon number of 6 to 15, an alkoxy group having a carbon number of 1 to 8 or a halogeno group. Also, two members out of $L^{10}$, $R^4$ and $R^5$ may combine to form a ring.

$R^6$ and $R^7$ may be the same or different and each represents a hydrogen atom, an alkyl group, an aralkyl group, an aryl group or a halogeno group, and preferably represents a hydrogen atom, an alkyl group having a carbon number of 1 to 8 or an aryl group having a carbon number of 6 to 15. Also, two members out of $L^{10}$, $R^6$ and $R^7$ may combine to form a ring. $L^{11}$ and $L^{12}$ may be the same or different and each represents a single bond, a double bond or a divalent aliphatic hydrocarbon group, and preferably represents a single bond, a double bond or a methylene group. A represents a mononuclear or polynuclear aromatic ring and preferably represents an aromatic ring having a carbon number of 6 to 18.

The compounds represented by formulae (16), (17) and (18) specifically include the followings:

that is, an aromatic tetracarboxylic dianhydride such as pyromellitic dianhydride, 3,3',4,4'-benzophenonetetracarboxylic dianhydride, 3,3',4,4'-biphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)-bis(iminocarbonyl)]diphthalic dianhydride, adduct of hydroquinone diacetate and trimellitic anhydride, and adduct of diacetyldiamine and trimellitic anhydride; an alicyclic tetracarboxylic dianhydride such as 5-(2,5-dioxotetrahydrofuryl)-3-methyl-3-cyclohexy-1,2-dicarboxylic anhydride (EPICLON B-4400, produced by Dainippon Ink and Chemicals Inc.), 1,2,3,4-cyclopentanetetracarboxylic dianhydride, 1,2,4,5-cyclohexanetetracarboxylic dianhydride and tetrahydrofurantetracarboxylic dianhydride; and an aliphatic tetracarboxylic dianhydride such as 1,2,3,4-butanetetracarboxylic dianhydride and 1,2,4,5-pentanetetracarboxylic dianhydride.

Examples of the method for introducing a structural unit derived from a compound obtained by ring-opening such a tetracarboxylic dianhydride by a diol compound into a polyurethane resin include the following methods: a) a method of reacting a diisocyanate compound with an alcohol-terminated compound obtained by ring-opening the tetracarboxylic dianhydride by a diol compound; and b) a method of reacting the tetracarboxylic dianhydride with an alcohol-terminated urethane compound obtained by reacting a diisocyanate compound under diol compound-excess conditions.

The diol compound used here specifically include the followings:

that is, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohaxanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct oxide of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, and bis(2-hydroxyethyl) isophthalate.

IV) Other Diol Compounds

In addition, for the synthesis of a polyurethane resin having a carboxyl group, another diol compound having no carboxyl group, which may have another substituent incapable of reacting with isocyanate, may be further used in combination. Such a diol compound includes the following compounds:

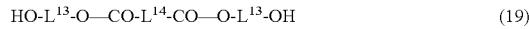

HO-L$^{13}$-O—CO-L$^{14}$-CO—O-L$^{13}$-OH (19)

HO-L$^{14}$-CO—O-L$^{13}$-OH (20)

In the formulae, $L^{13}$ and $L^{14}$ may be the same or different and each represents a divalent aliphatic hydrocarbon group, an aromatic hydrocarbon group or a heterocyclic group, which may have a substituent (for example, an alkyl group, an aralkyl group, an aryl group, an alkoxy group, an aryloxy group, or a halogen atom such as —F, —Cl, —Br and —I). If desired, each of $L^{13}$ and $L^{14}$ may have another functional group incapable of reacting with an isocyanate group, such as carbonyl group, ester group, urethane group, amido group and ureido group. Incidentally. $L^{13}$ and $L^{14}$ may form a ring.

Specific examples of the compounds represented by formulae (19) and (20) include (Compound No. 19) to (Compound No. 35) illustrated below.

(No. 19)

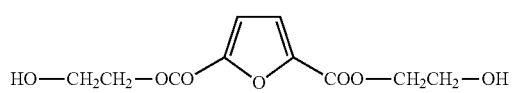

(No. 20)

HO—CH$_2$CH$_2$—OCO—CH=CH—COO—CH$_2$CH$_2$—OH

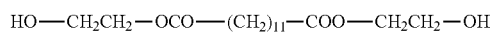 (No. 21)

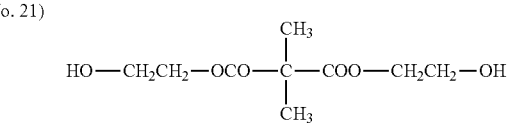 (No. 22)

-continued

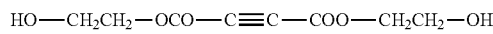 (No. 23)

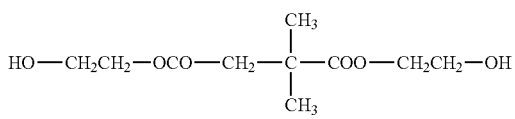 (No. 24)

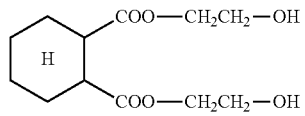 (No. 25)

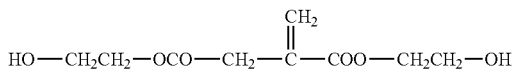 (No. 26)

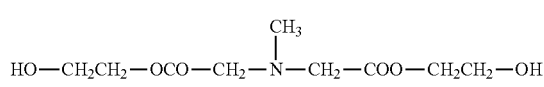 (No. 27)

 (No. 28)

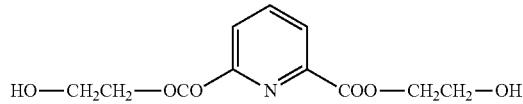 (No. 29)

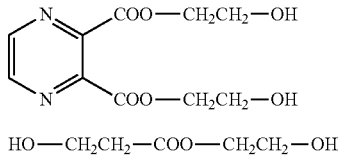 (No. 30)

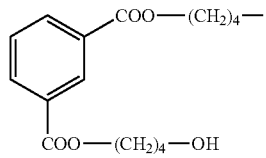 (No. 31)

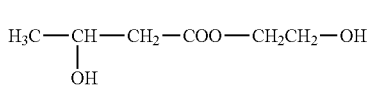 (No. 32)

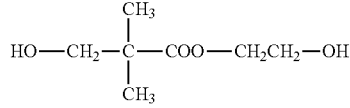 (No. 33)

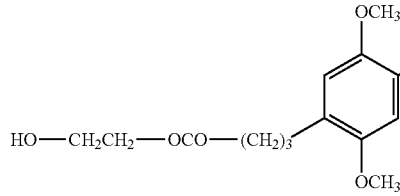 (No. 34)

 (No. 35)

A diol compound represented by the following formula (21) or (22) may be also suitably used.

HO(CH$_2$)$_c$OH (21)

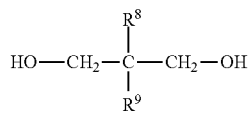 (22)

In the formulae, $R^8$ and $R^9$ may be the same or different and each is an alkyl group which may have a substituent, c represents an integer of 2 or more and is preferably an integer of 2 to 100.

The diol compounds represented by formulae (21) and (22) specifically include the followings:

that is, as formula (21), ethylene glycol, 1,3-propanediol, 1,4-butanediol, 1,5-pentanediol, 1,6-hexanediol, 1,7-heptanediol and 1,8-octanediol; and as formula (22), compounds illustrated below.

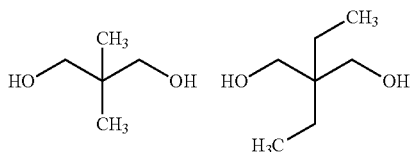

-continued

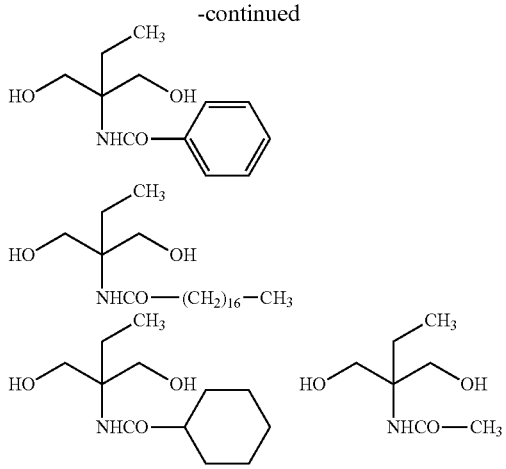

In addition, a diol compound represented by the following formula (23) or (24) may be also suitably used:

$$HO\text{-}L^{15}\text{-}NH\text{—}CO\text{-}L^{16}\text{-}CO\text{—}NH\text{-}L^{15}\text{-}OH \quad (23)$$

$$HO\text{-}L^{16}\text{-}CO\text{—}NH\text{-}L^{15}\text{-}OH \quad (24)$$

In the formulae, $L^{15}$ and $L^{16}$ may be the same or different and each represents a divalent aliphatic hydrocarbon group, an aromatic hydrocarbon group or a heterocycle group, which may have a substituent (for example, an alkyl group, an aralkyl group, an aryl group, an alkoxy group, an aryloxy group or a halogen atom (—F, —Cl, —Br, —I)). If desired, each of $L^{15}$ and $L^{16}$ may have another functional group incapable of reacting with an isocyanate group, such as carbonyl group, ester group, urethane group, amido group and ureido group. Incidentally, $L^{15}$ and $L^{16}$ may form a ring.

Specific examples of the compounds represented by formulae (23) and (24) include the compounds illustrated below.

Furthermore, a diol compound represented by the following formula (25) or (25) may be also suitably used.

$$HO\text{—}Ar^2\text{-}(L^{17}\text{-}Ar^3)_n\text{—}OH \quad (25)$$

$$HO\text{—}Ar^2\text{-}L^{17}\text{-}OH \quad (26)$$

In the formulae, $L^{17}$ represents a divalent aliphatic hydrocarbon group which may have a substituent (preferably, for example, an alkyl group, an aralkyl group, an aryl group, an alkoxy group, an aryloxy group or a halogeno group). If desired, $L^{17}$ may have another functional group incapable of reacting with an isocyanate group, such as ester group, urethane group, amido group and ureido group. $Ar^2$ and $Ar^3$ may be the same or different and each represents a divalent aromatic hydrocarbon group which may have a substituent, and preferably represents an aromatic group having a carbon number 6 to 15. n represents an integer of 0 to 10.

The diol compounds represented by formulae (25) and (26) specifically include the followings:

that is, catechol, resorcin, hydroquinone, 4-methylcatechol, 4-tert-butylcatechol, 4-acetylcatechol, 3-methoxycatechol, 4-phenylcatechol, 4-methylresorcinol, 4-ethylresorcinol, 4-tert-butylresorcinol, 4-hexylresorcinol, 4-chlororesorcinol, 4-benzylresorcinol, 4-acetylresorcinol, 4-carbomethoxyresorcinol, 2-methylresorcinol, 5-methylresorcinol, tert-butylhydroquinone, 2,5-di-tert-butylhydroquinone, 2,5-di-tert-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-clihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyebenzene, bis(4-hydroxyphenyl)methylamine, 1,3-dihydroxynaphthalene, 1,4-dihydroxynaphthalene, 1,5-dihydroxynaphthalene, 2,6-

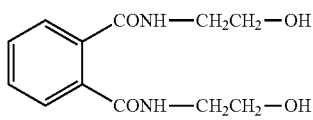
(No. 36)

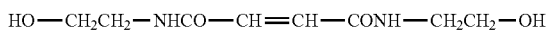
(No. 37)
$$HO\text{—}CH_2CH_2\text{—}NHCO\text{—}CH\text{=}CH\text{—}CONH\text{—}CH_2CH_2\text{—}OH$$

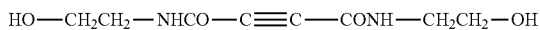
(No. 38)
$$HO\text{—}CH_2CH_2\text{—}NHCO\text{—}C\text{≡}C\text{—}CONH\text{—}CH_2CH_2\text{—}OH$$

(No. 39)
$$HO\text{—}CH_2CH_2\text{—}NHCO\text{—}(CH_2)_3\text{—}CONH\text{—}CH_2CH_2\text{—}OH$$

(No. 40)
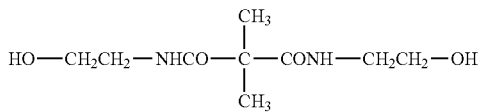

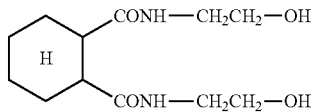
(No. 41)

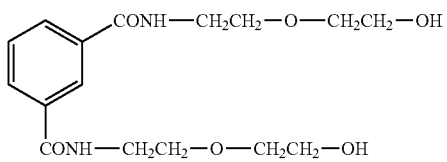
(No. 42)

(No. 43)
$$HO\text{—}CH_2CH_2\text{—}O\text{—}CH_2CH_2\text{—}NHCO(CH_2)_4CONH\text{—}CH_2CH_2\text{—}O\text{—}CH_2CH_2\text{—}OH$$

(No. 44)
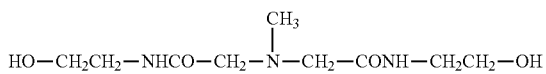

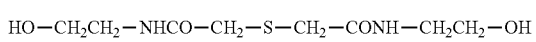
(No. 45)
$$HO\text{—}CH_2CH_2\text{—}NHCO\text{—}CH_2\text{—}S\text{—}CH_2\text{—}CONH\text{—}CH_2CH_2\text{—}OH$$

dihydroxynaphthalene, 1,5-dihydroxyanthraquinone, 2-hydroxybenzyl alcohol, 4-hydroxybenzyl alcohol, 2-hydroxy-3,5-di-tert-butylbenzyl alcohol, 4-hydroxy-3,5-di-tert-butylbenzyl alcohol, 4-hydroxyphenethyl alcohol, 2-hydroxyethyl-4-hydroxybenzoate, 2-hydroxyethyl-4-hydroxyphenyl acetate and resorcinol mono-2-hydroxyethyl ether.

A diol compound represented by the following formula (27), (28) or (29) may be also suitably used.

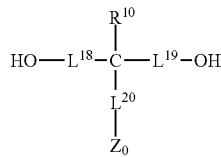 (27)

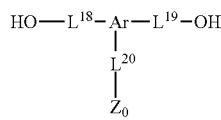 (28)

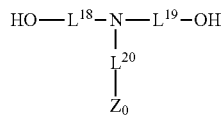 (29)

In the formula, $R^{10}$ represents a hydrogen atom or an alkyl, aralkyl, aryl, alkoxy or aryloxy group which may have a substituent (for example, a cyano group, a nitro group, a halogen atom (—F, —Cl, —Br, —I), —CONH$_2$, —COOR$^{11}$, —OR$^{11}$, —NHCONHR$^{11}$, —NHCOOR$^{11}$, —NHCOR$^{11}$, —OCONHR$^{11}$, —CONHR$^{11}$ (wherein $R^{11}$ represents an alkyl group having a carbon number of 1 to 10 or an aralkyl group having a carbon number of 7 to 15)), and preferably represents a hydrogen atom, an alkyl group having a carbon number of 1 to 8 or an aryl group having a carbon number of 6 to 15. $L^{18}$, $L^{19}$ and $L^{20}$ may be the same or different and each represents a single bond or a divalent aliphatic or aromatic hydrocarbon residue which may have a substituent (preferably, for example, an alkyl group, an aralkyl group, an aryl group, an alkoxy group or a halogen group), preferably represents an alkylene group having a carbon number of 1 to 20 or an arylene group having a carbon number of 6 to 15, and more preferably represents an alkylene group having a carbon number of 1 to 8. If desired, each of $L^{13}$, $L^{19}$ and $L^{20}$ may have another functional group incapable of reacting with an isocyanate group, such as carbonyl group, ester group, urethane group, amido group, ureido group and ether group. Incidentally, two or three members out of $R^{10}$, $L^{18}$, $L^{19}$ and $L^{20}$ may form a ring. Ar represents a trivalent aromatic hydrocarbon group which may have a substituent, and preferably represents an aromatic group having a carbon number of 6 to 15. $Z_0$ represents the following group:

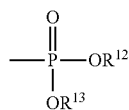

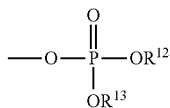

In the formulae, $R^{12}$ and $R^{13}$ may be the same or different and each represents a hydrogen atom, sodium, potassium, an alkyl group or an aryl group, preferably a hydrogen atom, an alkyl group having a carbon number of 1 to 8 or an aryl group having a carbon number of 6 to 15.

The diol compounds represented by formulae (27), (28) or (29) having a phosphonic acid group, a phosphoric acid group and/or an ester group thereof are synthesized, for example, by the following method After protecting, if desired, the hydroxyl group of a halogen compound represented by the following formula (30), (31) or (32), the compound is subjected to phosphonate ester formation by Michaelis-Arbuzov reaction represented by formula (33) and, if desired, further hydrolyzed with hydrogen bromide or the like, whereby the synthesis is performed.

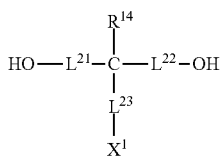 (30)

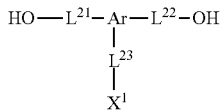 (31)

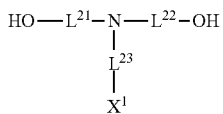 (32)

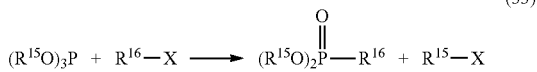 (33)

In the formulae, $R^{14}$, $L^{21}$, $L^{22}$, $L^{23}$ Ar have the same meanings as $R^{10}$, $L^{18}$, $L^{19}$, $L^{20}$ and Ar, respectively, in formulae (27), (28) and (29). $R^{15}$ represents an alkyl group or an aryl group, preferably an alkyl group having a carbon number of 1 to 8 or an aryl group having a carbon number of 6 to 15. $R^{16}$ is a residue formed by removing $X^1$ in formula (30), (31) or (32), and $X^1$ represents a halogen atom, preferably Cl, Br or I.

Also, the synthesis is performed by a method of hydrolyzing the compound after the reaction with a phosphorous oxychloride represented by formula (34):

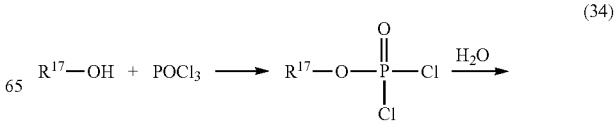 (34)

-continued

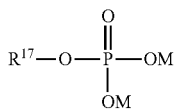

In the formulae, $R^{17}$ has the same meaning as $R^{15}$ in formula (33), and M represents a hydrogen atom, sodium or potassium.

In the case where the polyurethane resin of the present invention has a phosphonic acid group, the resin may be also synthesized by reacting a diisocyanate compound represented by formula (4) and a phosphoric acid ester group-containing diol compound represented by formula (27), (28) or (29), thereby effecting polyurethane resin formation, and then hydrolyzing the resin with hydrogen bromide or the like.

Similarly to the diol compound, an amino group-containing compound represented by the following formula (35) or (36) may be also reacted with a diisocyanate compound represented by formula (4) to form a urea structure and thereby incorporated into the polyurethane resin structure.

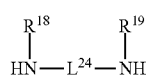 (35)

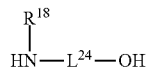 (36)

In the formulae, $R^{18}$ and $R^{19}$ may be the same or different and each represents a hydrogen atom or an alkyl, aralkyl or aryl group which may have a substituent (for example, an alkoxy group, a halogen atom (—F, —Cl, —Br, —I), an ester group or a carboxyl group), preferably represents a hydrogen atom, an alkyl group having a carbon number of 1 to 8, which may have a carboxyl group as the substituent, or an aryl group having a carbon number of 6 to 15. $L^{24}$ represents a divalent aliphatic hydrocarbon, an aromatic hydrocarbon group or a heterocycle group, which may have a substituent (for example, an alkyl group, an aralkyl group, an aryl group, an alkoxy group, an aryloxy group, a halogen atom (—F, —Cl, —Br, —I) or a carboxyl group). If desired, $L^{24}$ may have another functional group incapable of reacting with an isocyanate group, such as carbonyl group, ester group, urethane group and amido group. Incidentally, two members out of $R^{18}$, $L^{24}$ and $R^{19}$ may form a ring.

Specific examples of the compounds represented by formulae (35) and (36) include the followings:

an aliphatic diamine compound such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cystine and isophoronediamine;

an aromatic diamine compound such as o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis-(4-aminophenyl)sulfone, 4-carboxy-o-phenylenediamine, 3-carboxy-m-phenylenediamine, 4,4'-diaminophenyl ether and 1,8-naphthalenediamine; a heterocyclic amine compound such as 2-aminoimidazole, 3-aminotriazole, 5-amino-1H-tetrazole, 4-aminopyrazole, 2-aminobenzimidazole, 2-amino-5-carboxy-triazole, 2,4-diamino-6-methyl-S-triazine, 2,6-diaminopyridine, L-histidine, DL-tryptophan and adenine; and an aminoalcohol or aminophenol compound such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol and L-tyro sine.

The polyurethane resin is synthesized by heating the above-described isocyanate compound and diol compound in an aprotic solvent having added thereto a known catalyst having activity according to reactivity of each compound. The molar ratio between the diisocyanate compound and the diol compound used is preferably from 0.8:1 to 1.2:1, and when an isocyanate group remains in the polymer terminal, the polymer is treated with alcohols or amines, whereby the resin is finally synthesized with no remaining of an isocyanate group.

As the polyurethane resin, a resin having the above-described polymerizable group (such as unsaturated group) on the terminal, main chain or side chain of the polymer is also suitably used. The unsaturated group is, among others, preferably a carbon-carbon double bond in view of easy occurrence of a crosslinking reaction.

The method for introducing an unsaturated group into the polymer terminal include the following method. That is, the unsaturated group may be introduced by using unsaturated group-containing alcohols or amines in the treatment with alcohols or amines, which is applied when an isocyanate group remains in the polymer chain in the above-described process of synthesizing the polyurethane resin. Such a compound specifically includes the compounds illustrated below.

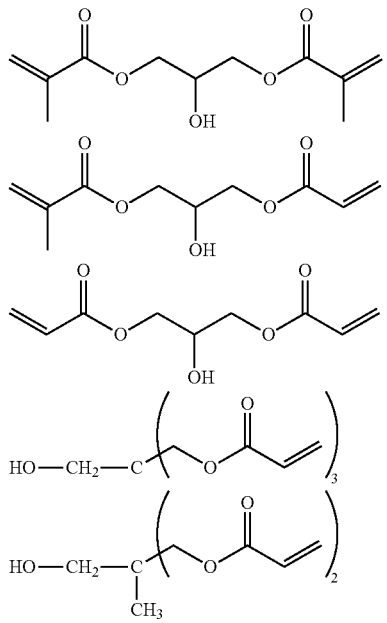

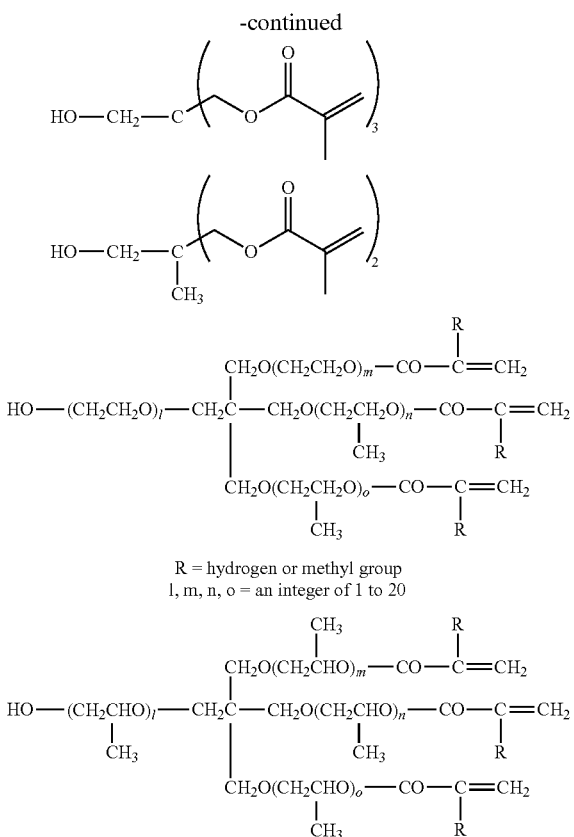
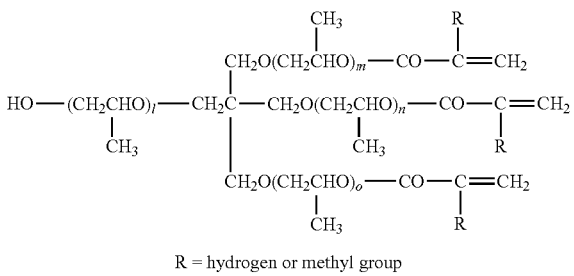

n = an integer of 1 to 20

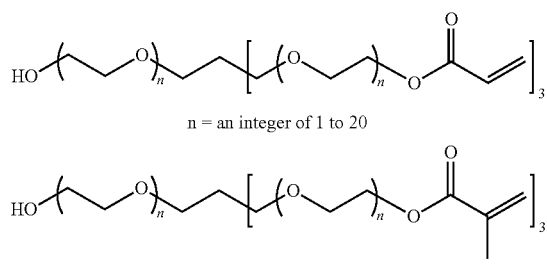

n = an integer of 1 to 20

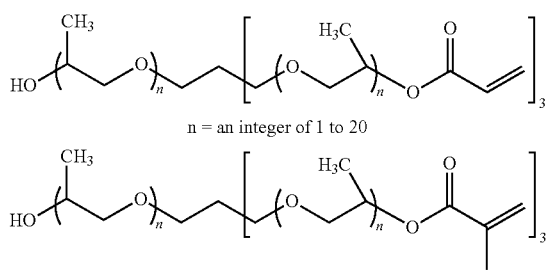

n = an integer of 1 to 20

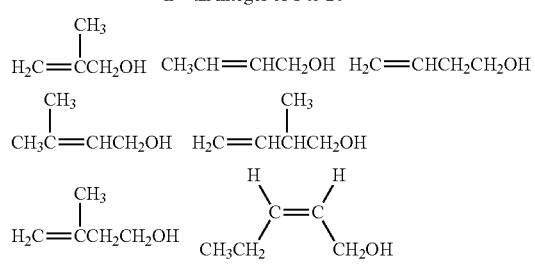

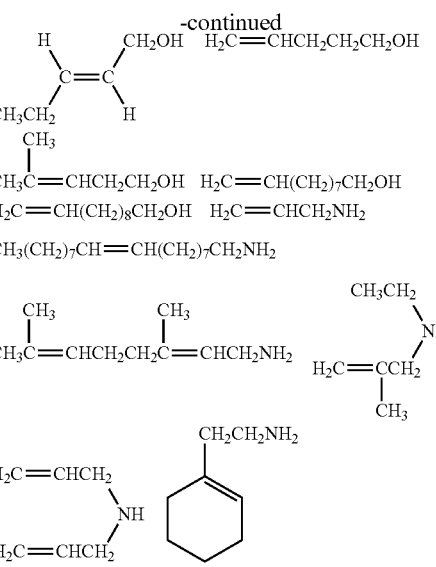

The method for introducing an unsaturated group into the main chain or the side chain includes a method of using a diol compound having an unsaturated group for the synthesis of the polyurethane resin. The diol compound having an unsaturated group specifically includes the following compounds.

Diol compounds represented by formulae (37) and (38). Specific examples thereof include the compounds described below.

 (37)

 (38)

Specific examples of the diol compound represented by formula (37) include 2-butene-1,4-diol, and specific examples of the diol compound represented by formula (38) include cis-2-butene-1,4-diol and trans-2-butene-1,4-diol.

A diol compound having an unsaturated group in the side chain. Specific examples thereof include the compounds illustrated below.

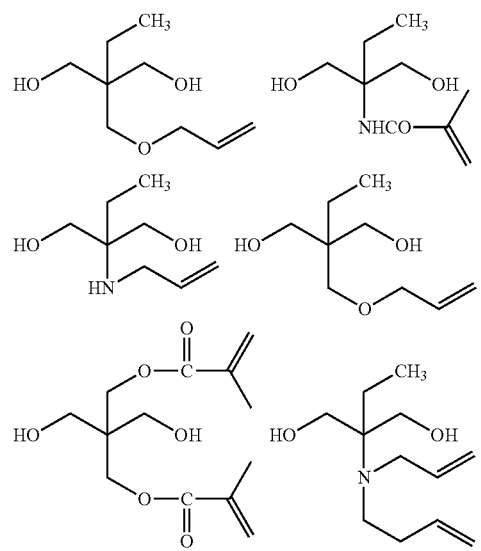

-continued

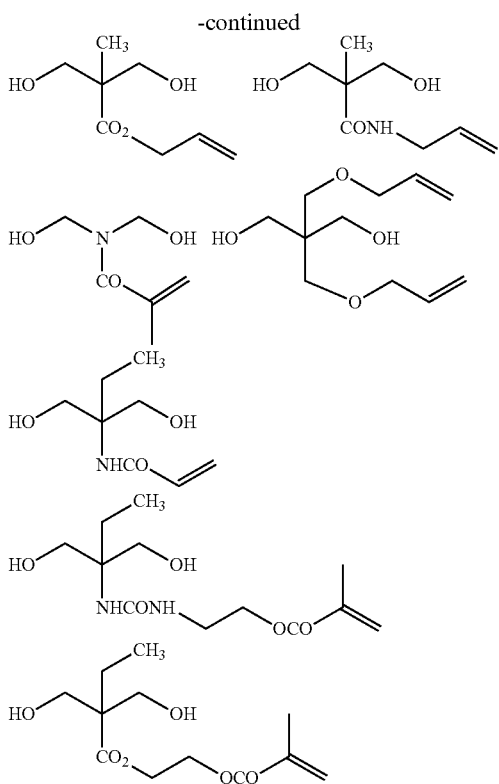

The polyurethane resin preferably contains an aromatic group in the main chain and/or the side chain. More preferably, the content of the aromatic group is from 10 to 80 wt % in the polyurethane resin.

In the case where the polyurethane resin is a polyurethane resin having a carboxyl group, the content of the carboxyl group is preferably 0.4 meq/g or more, more preferably from 0.4 to 3.5 meq/g.

The weight average molecular weight (Mw) of the resin (A) is preferably from 2,000 to 300,000, more preferably from 2,500 to 50,000, and most preferably from 3,000 to 35,000.

As for the resin (A), one resin may be used alone, or two or more resins may be used.

The content of the resin (A) is preferably from 10 to 70 mass %, more preferably from 15 to 65 mass %, still more preferably from 20 to 60 mass %, based on the total solid content of the adhesive composition.

(B) Polymerizable Compound

The adhesive composition preferably contains a polymerizable compound (hereinafter, sometimes simply referred to as compound (B)).

The compound (B) is different from the resin (A). That is, the compound (B) is typically a low molecular compound and is preferably a low molecular compound having a molecular weight of 2,000 or less, more preferably a low molecular compound having a molecular weight of 1,500 or less, still more preferably a low molecular compound having a molecular weight of 900 or less. The molecular weight is usually 100 or more.

The polymerizable group in the polymerizable compound is a group capable of developing adhesiveness and undergoing a reaction upon irradiation with an actinic ray or radiation to lose the polymerization activity and decrease the adhesiveness.

That is, the polymerizable compound can function as the above-described "adhesive capable of decreasing in the adhesiveness upon irradiation with an actinic ray or radiation".

The polymerizable compound is specifically selected from compounds having at least one, preferably two or more, terminal ethylenically unsaturated bond. These compounds are widely known in this industrial field and in the present invention, such compounds can be used without any particular limitation. The compound may have any chemical form such as monomer, prepolymer (that is, dimer, trimer or oligomer) or a mixture or multimer thereof. As for the polymerizable compound for use in the present invention, one compound may be used alone, or two or more compounds may be used in combination.

More specifically, examples of the monomer and a prepolymer thereof include an unsaturated carboxylic acid (such as acrylic acid, methacrylic acid, itaconic acid, crotonic acid, isocrotonic acid and maleic acid), its esters and amides, and a multimer thereof. Esters of an unsaturated carboxylic acid and an aliphatic polyhydric alcohol compound, amides of an unsaturated carboxylic acid and a polyvalent amine compound, and multimers thereof are preferred. In addition, for example, an addition reaction product of unsaturated carboxylic acid esters or amides having a nucleophilic substituent such as hydroxyl group, amino group and mercapto group, with monofunctional or polyfunctional isocyanates or epoxies, and a dehydration condensation reaction product with a monofunctional or polyfunctional carboxylic acid, may be also suitably used. Furthermore, an addition reaction product of unsaturated carboxylic acid esters or amides having an electrophilic substituent such as isocyanate group and epoxy group, with monofunctional or polyfunctional alcohols, amines or thiols, and a substitution reaction product of unsaturated carboxylic acid esters or amides having a leaving substituent such as halogen group and tosyloxy group, with monofunctional or polyfunctional alcohols, amines or thiols, are also preferred. As other examples, compounds where the above-described unsaturated carboxylic acid is replaced by an unsaturated phosphonic acid, a vinylbenzene derivative such as styrene, a vinyl ether, an allyl ether or the like, may be also used.

As for specific examples of the ester monomer of a polyhydric alcohol compound with an unsaturated carboxylic acid, examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritol hexaacrylate, pentaerythritol tetraacrylate, sorbitol triacrylate, sorbitol tetraacrylate, sorbitol pentaacrylate, sorbitol hexaacrylate, tri (acryloyloxyethyl)isocyanurate, isocyanuric acid ethylene oxide (EO)-modified triacrylate, and polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane and bis[p-(methacryloxyethoxy) phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of the crotonic acid ester include ethylene glycol dicrotonate, tetramethylene glycol dicrotonate, pentaerythritol dicrotonate and sorbitol tetradicrotonate.

Examples of the isocrotonic acid ester include ethylene glycol diisocrotonate, pentaerythritol diisocrotonate and sorbitol tetraisocrotonate.

Examples of the maleic acid ester include ethylene glycol dimaleate, triethylene glycol dimaleate, pentaerythritol dimaleate and sorbitol tetramaleate.

Other examples of the ester, which are suitably used, include aliphatic alcohol-based esters described in JP-B-46-27926 (the term "JP-B" as used herein means an "examined Japanese patent publication"), JP-B-51-47334 and JP-A-57-196231, those having an aromatic skeleton described in JP-A-59-5240, JP-A-59-5241 and JP-A-2-226149, and those containing an amino group described in JP-A-1-165613.

Specific examples of the amide monomer of a polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine trisacrylamide, xylylenebisacrylamide and xylylenebismethacrylamide.

Other preferred examples of the amide-based monomer include those having a cyclohexylene structure described in JP-B-54-21726.

A urethane-based addition-polymerizable compound produced using an addition reaction of isocyanate with a hydroxyl group is also preferred, and specific examples thereof include a vinyl urethane compound having two or more polymerizable vinyl groups per molecule described in JP-B-48-41708, which is obtained by adding a hydroxyl group-containing vinyl monomer represented by the following formula (A) to a polyisocyanate compound having two or more isocyanate groups per molecule:

CH$_2$=C(R$_4$)COOCH$_2$CH(R$_5$)OH (A)

(wherein each of R$_4$ and R$_5$ represents H or CH$_3$).

In addition, urethane acrylates described in JP-A-51-37193, JP-B-2-32293 and JP-B-2-16765, and urethane compounds having an ethylene oxide-based skeleton described in JP-B-58-49860, JP-B-56-17654, JP-B-62-39417 and JP-B-62-39418 are also suitably used.

As for the polymerizable compound, the compounds described in paragraphs 0095 to 0108 of JP-A-2009-288705 may be suitably used also in the present invention.

An the polymerizable compound, an ethylenically unsaturated group-containing compound having, as a polymerizable monomer, at least one addition-polymerizable ethylene group and having a boiling point of 100° C. or more under normal pressure is also preferred. Examples thereof include a monofunctional acrylate or methacrylate such as polyethylene glycol mono(meth)acrylate, polypropylene glycol mono (meth)acrylate and phenoxyethyl (meth)acrylate; a polyfunctional acrylate or methacrylate such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, compound obtained by adding ethylene oxide or propylene oxide to a polyfunctional alcohol (e.g., glycerin, trimethylolethane) and (meth)acrylating the adduct, urethane (meth)acrylates described in JP-B-48-41708, JP-B-50-6034 and JP-A-51-37193, polyester acrylates described in JP-A-48-64183, JP-B-49-43191 and JP-B-52-30490, and epoxy acrylates as a reaction product of epoxy resin and (meth)acrylic acid; and a mixture thereof.

Examples of the compound further include a polyfunctional (meth)acrylate obtained by reacting a polyfunctional carboxylic acid with a compound having a cyclic ether group and an ethylenically unsaturated group, such as glycidyl (meth)acrylate.

As other preferred polymerizable compounds, the compounds having a fluorene ring and a bifunctional or higher functional ethylenically polymerizable group, described in JP-A-2010-160418, JP-A-2010-129825 and Japanese Patent 4,364,216, and a cardo resin may be also used.

Other examples of the polymerizable compound include specific unsaturated compounds described in JP-B-46-43946, JP-B-1-40337 and JP-B-1-40336, and a vinyl phosphonic acid-based compound described in JP-A-2-25493. In some cases, a structure containing a perfluoroalkyl group described in JP-A-61-22048 is suitably used. Furthermore, those described as a photocurable monomer or oligomer in *Adhesion*, Vol. 20, No. 7, pp. 300-308 (1984) may be also used.

As the compound having a boiling point of 100° C. or more under normal pressure and having at least one addition-polymerizable ethylenically unsaturated group, the compounds described in paragraphs [0254] to [0257] of JP-A-2008-292970 are also preferred.

In addition, radical polymerizable monomers represented by the following formulae (MO-1) to (MO-5) may be suitably used. In the formulae, when T is an oxyalkylene group, R is bonded to the terminal on the carbon atom side.

(MO-1)

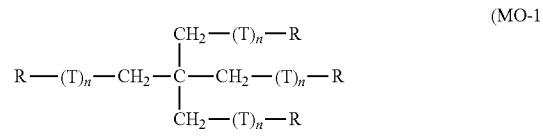

(MO-2)

(MO-3)

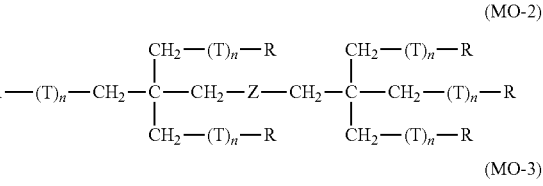

(MO-4)

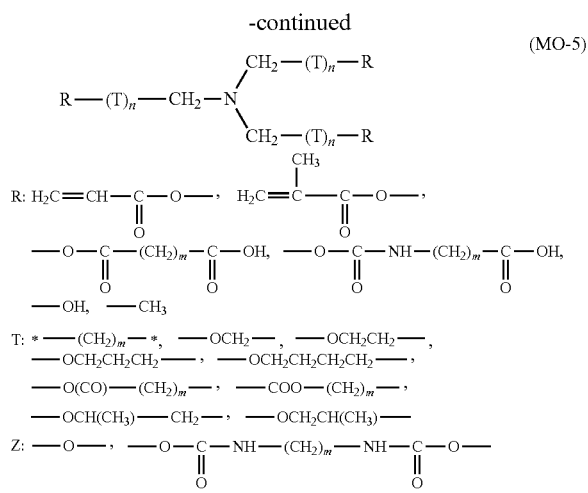

In the formulae, n is from 0 to 14 and m is from 1 to 8. Each R or T may be the same as or different from every other R or T present in one molecule.

In each of the radical polymerizable monomers represented by formulae (MO-1) to (MO-5), at least one of the plurality of R's represents a group represented by —OC(=O)CH=CH$_2$ or —OC(=O)C(CH$_3$)=CH$_2$.

As for specific examples of the radical polymerizable monomers represented by formulae (MO-1) to (MO-5), the compounds described in paragraphs 0248 to 0251 of JP-A-2007-269779 may be suitably used also in the present invention.

Compounds obtained by adding an ethylene oxide or a propylene oxide to the above-described polyfunctional alcohol and (meth)acrylating the adduct, described as the compounds of formulae (1) and (2) together with their specific examples in JP-A-10-62986, may be also used as the polymerizable compound.

Above all, preferred polymerizable compounds are dipentaerythritol triacrylate (as a commercial product, KAYARAD D-330, produced by Nippon Kayaku Co., Ltd.), dipentaerythritol tetraacrylate (as a commercial product, KAYARAD D-320, produced by Nippon Kayaku Co., Ltd.), dipentaerythritol penta(meth)acrylate (as a commercial product, KAYARAD D-310, produced by Nippon Kayaku Co., Ltd.), dipentaerythritol hexa(meth)acrylate (as a commercial product, KAYARAD DPHA, produced by Nippon Kayaku Co., Ltd.), and structures where the (meth)acryloyl group of these compounds is bonded through an ethylene glycol or propylene glycol residue. Their oligomer types may be also used.

The polymerizable compound may be a polyfunctional monomer having an acid group such as carboxyl group, sulfonic acid group and phosphoric acid group. Accordingly, an ethylenic compound having an unreacted carboxyl group as in the case of the mixture above may be directly used, but, if desired, a non-aromatic carboxylic anhydride may be reacted with a hydroxyl group of the above-described ethylenic compound to introduce an acid group. In this case, specific examples of the non-aromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the acid group-containing monomer is preferably a polyfunctional monomer which is an ester of an aliphatic polyhydroxy compound and an unsaturated carboxylic acid and is imparted with an acid group by reacting a non-aromatic carboxylic anhydride with an unreacted hydroxyl group of an aliphatic polyhydroxy compound, more preferably the ester above where the aliphatic polyhydroxy compound is pentaerythritol and/or dipentaerythritol. Examples of the commercial product thereof include polybasic acid-modified acryl oligomers M-510 and M-520 produced by Toagosei Co., Ltd.

One of these monomers may be used alone, but since it is difficult in view of production to use a single compound, two or more monomers may be mixed and used. Also, as the monomer, an acid group-free polyfunctional monomer and an acid group-containing monomer may be used in combination, if desired. The acid value of the acid group-containing polyfunctional monomer is preferably from 0.1 to 40 mg-KOH/g, more preferably from 5 to 30 mg-KOH/g. If the acid value of the polyfunctional monomer is too low, the developer solubility characteristics are reduced, whereas if it is excessively high, production or handling becomes difficult and the photopolymerization performance is reduced to impair the curability such as surface smoothness of pixel. Accordingly, in the case where two or more polyfunctional monomers differing in the acid group are used in combination or where an acid group-free polyfunctional monomer is used in combination, the monomers must be adjusted such that the acid value of the entire polyfunctional monomer falls in the range above.

Also, it is preferred to contain, as a polymerizable monomer, a polyfunctional monomer having a caprolactone structure.

The polyfunctional monomer having a caprolactone structure is not particularly limited as long as it has a caprolactone structure in a molecule thereof, but examples thereof include an ε-caprolactone-modified polyfunctional (meth)acrylate obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol, trimethylolmelamine, with a (meth)acrylic acid and ε-caprolactone. Among others, a polyfunctional monomer having a caprolactone structure represented by the following formula (1) is preferred:

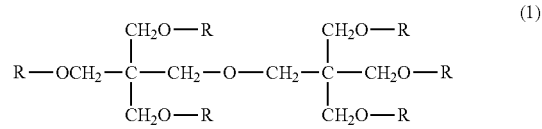

(wherein all of six R's are a group represented by the following formula (2) or from 1 to 5 members out of six R's are a group represented by the following formula (2), with the remaining members being a group represented by the following formula (3)):

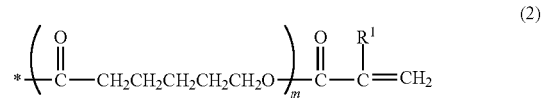

(wherein R$^1$ represents a hydrogen atom or a methyl group, m represents a number of 1 or 2, and "*" indicates a bond).

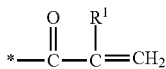
(3)

(wherein $R^1$ represents a hydrogen atom or a methyl group, and "*" indicates a bond).

The polyfunctional monomer having a caprolactone structure is commercially available as KAYARAD DPCA Series from Nippon Kayaku Co., Ltd., and examples thereof include DPCA-20 (a compound where in formulae (1) to (3), m=1, the number of groups represented by formula (2)=2, and all $R^1$s are a hydrogen atom), DPCA-30 (a compound where in the same formulae, m=1, the number of groups represented by formula (2)=3, and all $R^1$s are a hydrogen atom), DPCA-60 (a compound where in the same formulae, m=1, the number of groups represented by formula (2)=6, and all $R^1$s are a hydrogen atom), and DPCA-120 (a compound where in the same formulae, m=2, the number of groups represented by the general formula (2)=6, and all $R^1$s are a hydrogen atom). In the present invention, as for the polyfunctional monomer having a caprolactone structure, one monomer may be used alone, or two or more monomers may be mixed and used.

It is also preferred that the polyfunctional monomer is at least one compound selected from the group consisting of the compounds represented by the following formulae (i) and (ii):

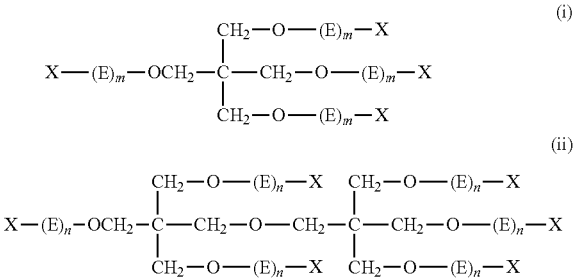

In formulae (i) and (ii), each E independently represents —$((CH_2)_yCH_2O)$— or —$((CH_2)_yCH(CH_3)O)$—, each y independently represents an integer of 0 to 10, and each X independently represents an acryloyl group, a methacryloyl group, a hydrogen atom or a carboxyl group.

In formula (i), the total number of acryloyl groups and methacryloyl groups is 3 or 4, each m independently represents an integer of 0 to 10, and the total of respective m is an integer of 0 to 40, provided that when the total of respective m is 0, any one X is a carboxyl group.

In formula (ii), the total number of acryloyl groups and methacryloyl group is 5 or 6, each n independently represents an integer of 0 to 10, and the total of respective n is an integer of 0 to 60, provided that when the total of respective n is 0, any one X is a carboxyl group.

In formula (i), m is preferably an integer of 0 to 6, more preferably an integer of 0 to 4, and the total of respective in is preferably an integer of 2 to 40, more preferably an integer of 2 to 16, still more preferably an integer of 4 to 8.

In formula (ii), n is preferably an integer of 0 to 6, more preferably an integer of 0 to 4, and the total of respective n is preferably an integer of 3 to 60, more preferably an integer of 3 to 24, still more preferably an integer of 6 to 12.

In a preferred embodiment of —$((CH_2)_yCH_2O)$— or —$((CH_2)_yCH(CH_3)O)$— in formula (i) or (ii), the terminal on the oxygen atom side is bonded to X.

As for the compound represented by formula (i) or (ii), one compound may be used alone, or two or more compounds may be used in combination. In particular, an embodiment where all of 6 X's in formula (ii) are an acryloyl group is preferred.

The total content of the compound represented by formula (i) or (ii) in the polymerizable compound is preferably 20 mass % or more, more preferably 50 mass % or more.

The compound represented by formula (i) or (ii) can be synthesized through a step of binding a ring-opened skeleton of ethylene oxide or propylene oxide to pentaerythritol or dipentaerythritol by a ring-opening addition reaction, and a step of introducing a (meth)acryloyl group into the terminal hydroxyl group of the ring-opened skeleton by reacting, for example, (meth)acryloyl chloride, which are conventionally known steps. Each step is a well-known step, and the compound represented by formula (i) or (ii) can be easily synthesized by one skilled in the art.

Among the compounds represented by formulae (i) and (ii), a pentaerythritol derivative and/or a dipentaerythritol derivative are preferred.

The compounds specifically include the compounds represented by the following formulae (a) to (f) (hereinafter, sometimes referred to as "compounds (a) to (f)"), and compounds (a), (b), (e) and (f) are preferred.

Formula (a)

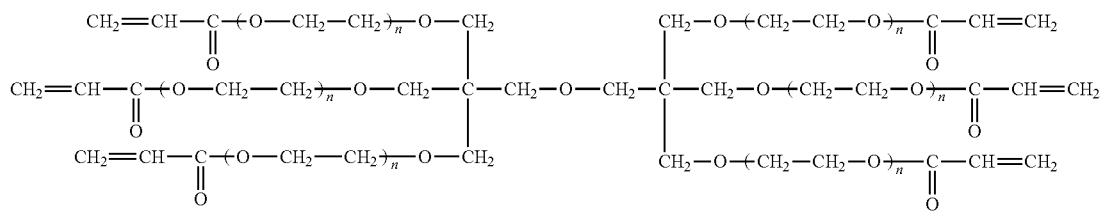

(the total of respective n is 6)

Formula (b)
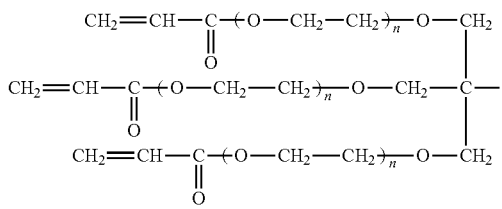 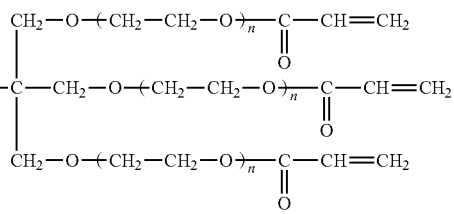

(the total of respective n is 12)

Formula (c)
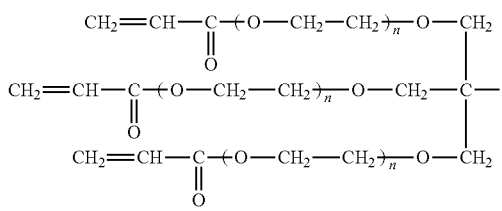 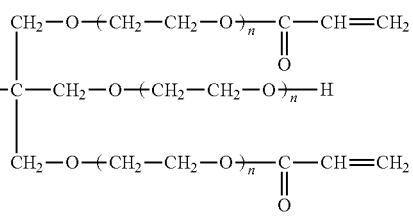

(the total of respective n is 12)

Formula (d)
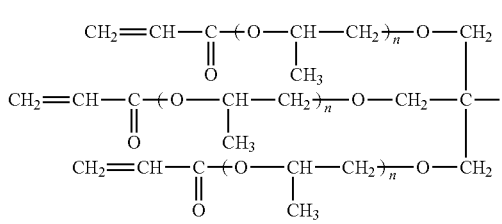 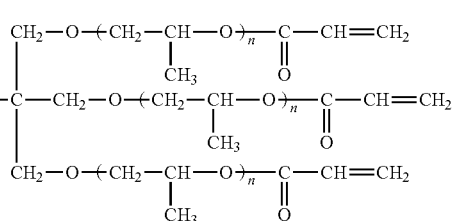

(the total of respective n is 6)

Formula (e)
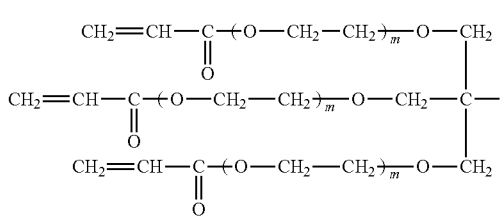 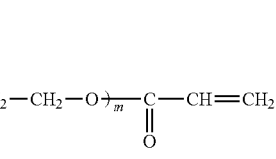

(the total of respective m is 4)

Formula (f)
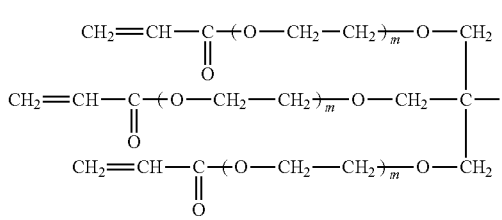

(the total of respective m is 12)

Examples of the commercial product of the monomers represented by formulae (i) and (ii) include SR-494 produced by Sartomer Company, Inc., which is a tetrafunctional acrylate having four ethyleneoxy chains; and DPCA-60 which is a hexafunctional acrylate having six pentyleneoxy chains, and TPA-330 which is a trifunctional acrylate having three isobutyleneoxy chains, both produced by Nippon Kayaku Co., Ltd.

Furthermore, urethane acrylates described in JP-B-48-41708, JP-A-51-37193, JP-B-2-32293 and JP-B-2-16765, and urethane compounds having an ethylene oxide-based skeleton described in JP-B-58-49860. JP-B-56-17654, JP-B-62-39417 and JP-B-62-39418, are also suitable as the polymerizable compound. In addition, addition-polymerizable compounds having an amino structure or a sulfide structure in the molecule described in JP-A-63-277653, JP-A-63-260909 and JP-A-1-105238 may be also used as the polymerizable compound.

Examples of the commercial product of the polymerizable compound include Urethane Oligomers UAS-10, UAB-140 (both produced by Sanyo Kokusaku Pulp Co., Ltd.), UA-7200 (produced by Shin-Nakamura Chemical Co., Ltd.), DPHA- 40H (produced by Nippon Kayaku Co., Ltd.), UA-306H, UA-306T, UA-306I, AH-600, T-600, and AI-600 (all produced by Kyoeisha Chemical Co., Ltd.).

A polyfunctional thiol compound having two or more mercapto (SH) group in the same molecule is also suitable as the polymerizable compound. In particular, a compound represented by the following formula (I) is preferred:

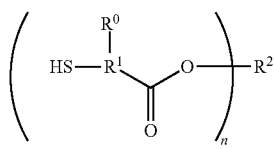

(I)

(wherein $R^1$ represents an alkyl group, $R^2$ represents an n-valent aliphatic group which may contain an atom other than carbon, $R^0$ represents an alkyl group but not H, and n represents 2 to 4).

Specific examples of the polyfunctional thiol compound represented by formula (I) include compounds having the following structural formulae, that is, 1,4-bis(3-mercaptobutyryloxy)butane [formula (II)], 1,3,5-tris(3-mercaptobutyryloxyethyl)-1,3,5-triazine-2,4,6(1H,3H,5H)-trione [formula (III)], and pentaerythritol tetrakis(3-mercaptobutyrate) [formula (IV)]. One of these polyfunctional thiols may be used, or a plurality thereof may be used in combination.

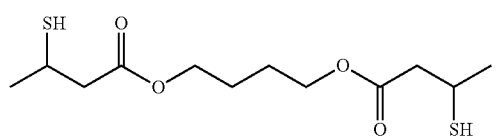

(II)

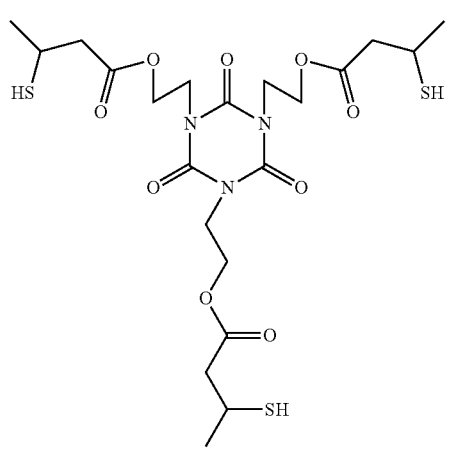

(III)

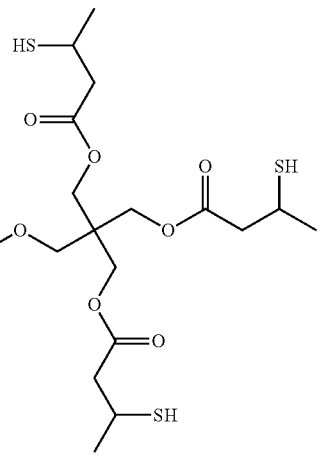

(IV)

The blending amount of the polyfunctional thiol compound in the adhesive composition is preferably from 0.3 to 8.9 wt %, more preferably from 0.8 to 6.4 wt %, based on the total solid content excluding the solvent. By the addition of the polyfunctional thiol, the stability, odor, sensitivity, adherence and the like of the adhesive composition can be improved.

As for the polymerizable compound, details of the structure and the use method such as single or combination use and added amount, may be arbitrarily set according to the design of final performance of the adhesive composition. For example, in view of sensitivity (efficiency in decreasing the adhesiveness with respect to irradiation with an actinic ray or radiation), a structure having a large unsaturated group content per molecular is preferred, and in many cases, a bifunctional or higher functional structure is preferred. From the standpoint of increasing the strength of the adhesive layer, a trifunctional or higher functional compound is preferred, and a method where polymerizable groups differing in the functional number or differing in the polymerizable group (for example, an acrylic acid ester, a methacrylic acid ester, a styrene-based compound and a vinyl ether-based compound) are used in combination to control both the sensitivity and the strength, is also effective. Furthermore, a combination use of trifunctional or higher functional polymerizable compounds differing in the ethylene oxide chain length is preferred. The selection and use method of the polymerizable compound are also important factors for the compatibility and dispersibility with other components (for example, the resin (A) and a polymerization initiator) contained in the adhesive composition. For example, the compatibility can be sometimes enhanced by using a low-purity compound or using two or more kinds of compounds in combination. Also, a specific structure may be selected with the purpose of improving the adherence to a carrier substrate.

The content of the polymerizable compound in the adhesive composition of the present invention is preferably from 20 to 95 mass %, more preferably from 25 to 90 mass %, still more preferably from 30 to 80 mass %, based on the solid content in the adhesive composition.

(C) Polymerization Initiator

From the standpoint of enhancing the sensitivity, the adhesive composition of the present invention preferably contains a polymerization initiator.

As for the polymerization initiator used in the present invention, the following compounds known as a polymerization initiator can be used.

The polymerization initiator is not particularly limited as long as it has an ability of initiating the polymerization of the resin (A) or the polymerizable compound, and the initiator can be appropriately selected from known polymerization initiators. For example, a compound having photosensitivity to light in the region from ultraviolet to visible is preferred.

The initiator may be an activator causing a certain action with a photoexcited sensitizer to produce an active radical or an initiator capable of initiating cationic polymerization according to the kind of the monomer.

The polymerization initiator preferably contains at least one compound having a molecule extinction coefficient of at least about 50 in the range of approximately from 300 to 800 nm (more preferably from 330 to 500 nm).

As the polymerization initiator, known compounds can be used without limitation, but examples thereof include a halogenated hydrocarbon derivative (for example, a compound having a triazine skeleton, a compound having an oxadiazole skeleton, and a compound having a trihalomethyl group), an acylphosphine compound such as acylphosphine oxide, hexaarylbiimidazole, an oxime compound such as oxime derivative, an organic peroxide, a thio compound, a ketone compound, an aromatic onium salt, a ketoxime ether, an aminoacetophenone compound, hydroxyacetophenone, an azo-based compound, an azide compound, a metallocene compound, an organoboron compound, and an iron-arene complex.

Examples of the halogenated hydrocarbon compound having a triazine skeleton include the compounds described in Wakabayashi et al., *Bull. Chem. Soc. Japan*, 42, 2924 (1969), the compounds described in Britain Patent 1,388,492, the compounds described in JP-A-53-133428, the compounds described in Germany Patent 3,337,024, the compounds described in F. C. Schaefer et al., *J. Org. Chem.*, 29, 1527 (1964), the compounds described in JP-A-62-58241, the compounds described in JP-A-5-281728, the compounds described in JP-A-5-34920, and the compounds described in U.S. Pat. No. 4,212,976.

The compounds described in U.S. Pat. No. 4,212,976 include, for example, a compound having an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, 2-tribromomethyl-5-styryl-1,3,4-oxadiazole).

Examples of the polymerization initiator other than those described above include an acridine derivative (such as 9-phenylacridine and 1,7-bis(9,9'-acridinyl)heptane), N-phenylglycine, a polyhalogen compound (such as carbon tetrabromide, phenyl tribromomethyl sulfone and phenyl trichloromethyl ketone), coumarins (such as 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-dimethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin and coumarin compounds described in JP-A-5-19475, JP-A-7-271028, JP-A-2002-363206, JP-A-2002-363207, JP-A-2002-363208 and JP-A-2002-363209), acylphosphine oxides (such as bis(2,4,6-trimethylbenzoyl)-phenylphosphine oxide, bis(2,6-dimethoxybenzoyl)-2,4,4-trimethyl-pentylphenylphosphine oxide and Lucirin TPO), metallocenes (such as bis(η5-2,4-cyclopentadien-1-yl)-bis(2,6-difluoro-3-(1H-pyrrol-1-yl)-phenyl)titanium and η5-cyclopentadienyl-η6-cumenyl-iron(1+)-hexafluorophosphate (1−)), and the compounds described in JP-A-53-133428, JP-B-57-1819, JP-B-57-6096, and U.S. Pat. No. 3,615,455.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, a benzophenonetetracarboxylic acid or a tetramethyl ester thereof, 4,4'-bis(dialkylamino)benzophenones (such as 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin ethers (such as benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone, and N-butyl-chloroacridone.

As the polymerization initiator, a hydroxyacetophenone compound, an aminoacetophenone compound, and an acylphosphine compound may be also suitably used. More specifically, for example, an aminoacetophenone-based initiator described in JP-A-10-291969 and an acylphosphine oxide-based initiator described in Japanese Patent 4225898 may be used.

As for the hydroxyacetophenone-based initiator, IRGACURE-184, DAROCUR-1173, IRGACURE-500, IRGACURE-2959 and IRGACURE-127 (trade names, all produced by CIBA Japan) may be used. As for the aminoacetophenone-based initiator, commercial products IRGACURE-907, IRGACURE-369 and IRGACURE-379 (trade names, all produced by CIBA Japan) may be used. The compounds described in JP-A-2009-191179, where the absorption wavelength is adjusted to match the long wavelength light source of, for example, 365 nm or 405 nm, may be also used as the aminoacetophenone-based initiator. As for the acylphosphine-based initiator, commercial products IRGACURE-819 and DAROCUR-TPO (trade names, both produced by CIBA Japan) may be used.

The polymerization initiator is more preferably an oxime-based compound. Specific examples of the oxime-based initiator which can be used include the compounds described in JP-A-2001-233842, the compounds describe in JP-A-2000-80068, and the compounds described in JP-A-2006-342166.

Examples of the oxime compound such as oxime derivative, which is suitably used as the polymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan- 1-one, 3-(4-toluenesulfonyloxy)iminobutan-2-one, and 2-ethoxycarbonyloxyimino-1-phenylpropan-1-one.

Examples of the oxime ester compound include the compounds described in *J. C. S. Perkin II*, pp. 1653-1660 (1979), *J. C. S. Perkin II*, pp. 156-162 (1979), *Journal of Photopolymer Science and Technology*, pp. 202-232 (1995), JP-A-2000-66385, JPA-2000-80068, P-T-2004-534797, and JP-A-2006-342166.

As the commercial product, IRGACURE-OXE01 (produced by CIBA Japan) and IRGACURE-OXE02 (produced by CIBA Japan) may be also suitably used.

As the oxime ester compound other than those described above, there may be used, for example, the compounds described in JP-T-2009-519904, where oxime is connected to the N-position of carbazole, the compounds described in U.S. Pat. No. 7,626,957, where a hetero-substituent is introduced into the benzophenone moiety, the compounds described in JP-A-2010-15025 and U.S. Patent Application Publication 2009-292039, where a nitro group is introduced into the dye moiety, the ketoxime-based compounds described in International Publication 2009-131189, the compounds described in U.S. Pat. No. 7,556,910, containing a triazine skeleton and an oxime skeleton within the same molecule, and the compounds described in JP-A-2009-221114, having an absorption maximum at 405 nm and exhibiting good sensitivity to a g-line light source.

Furthermore, cyclic oxime compounds described in JP-A-2007-231000 and JP-A-2007-322744 may be also suitably used. Among cyclic oxime compounds, the cyclic oxime compounds fused to a carbazole dye, described in JP-A-2010-32985 and JP-A-2010-185072, have high light absorptivity and are preferred in view of achieving high sensitivity.

Also, the compounds described in JP-A-2009-242469, having an unsaturated bond at a specific site of an oxime compound, can achieve high sensitivity by regenerating an active radical from a polymerization inactive radical and therefore, can be suitably used.

Most preferred compounds are an oxime compound having a specific substituent described in JP-A-2007-269779 and an oxime compound having a thioaryl group described in JP-A-2009-191061.

Specifically, the oxime-based polymerization initiator is preferably a compound represented by the following formula (OX-1). Incidentally, the compound may be an oxime compound where the N—O bond of oxime is (E) form, an oxime compound of (Z) form, or a mixture of (E) form and (Z) form.

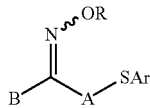
(OX-1)

(In formula (OX-1), each of R and B independently represents a monovalent substituent, A represents a divalent organic group, and Ar represents an aryl group.)

In formula (OX-1), the monovalent substituent represented by R is preferably a monovalent nonmetallic atom group.

Examples of the monovalent nonmetallic atom group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Also, the substituent may be further substituted with another substituent.

Examples of the substituent include a halogen atom, an aryloxy group, an alkoxycarbonyl group, an aryloxycarbonyl group, an acyloxy group, an acyl group, an alkyl group, an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an in-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quatemaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthonyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B in formula (OX-1) indicates an aryl group, a heterocyclic group, an arylcarbonyl group or a heterocyclic carbonyl group. These groups may have one or more substituents. Examples of the substituent include the substituents described above. Also, the substituent described above may be further substituted with another substituent.

Among others, structures shown below are preferred.

In the following structures, Y, X and n have the same meanings as Y, X and n, respectively, in formula (OX-2) described later, and preferred examples thereof are also the same.

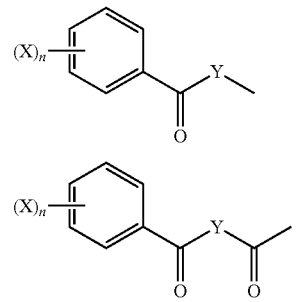

The divalent organic group represented by A in formula (OX-1) includes an alkylene group having a carbon number of 1 to 12, a cyclohexylene group, and an alkynylene group. These groups may have one or more substituents. Examples of the substituent include the substituents described above. Also, the substituent described above may be further substituted with another substituent.

Among others, from the standpoint of increasing the sensitivity and suppressing the coloration due to heating or aging, A in formula (OX-1) is preferably an unsubstituted alkylene group, an alkylene group substituted with an alkyl group (such as methyl group, ethyl group, tert-butyl group or dodecyl group), an alkylene group substituted with an alkenyl group (such as vinyl group or allyl group), or an alkylene group substituted with an aryl group (such as phenyl group, p-tolyl group, xylyl group, cumenyl group, naphthyl group, anthryl group, phenanthryl group or styryl group).

The aryl group represented by Ar in formula (OX-1) is preferably an aryl group having a carbon number of 6 to 30 and may have a substituent. Examples of the substituent are the same as those of the substituent introduced into a substituted aryl group described above as specific examples of the aryl group which may have a substituent.

Among others, from the standpoint of increasing the sensitivity and suppressing the coloration due to heating or aging, a substituted or unsubstituted phenyl group is preferred.

In formula (OX-1), in view of sensitivity, the structure "SAr" formed by Ar and S adjacent thereto in formula (OX-1) is preferably a structure shown below. Here, Me stands for a methyl group, and Et stands for an ethyl group.

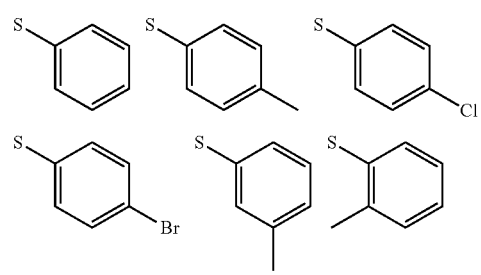

-continued

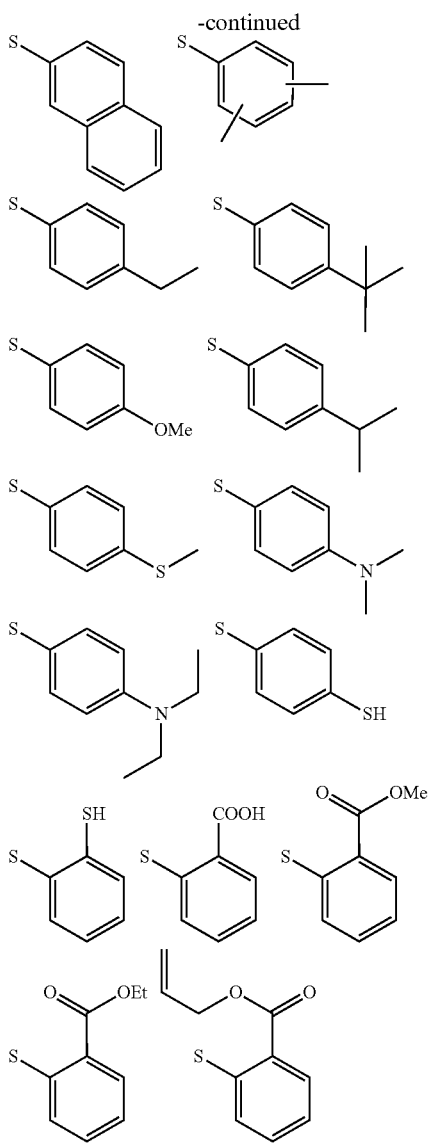

The oxime compound is preferably a compound represented by the following formula (OX-2):

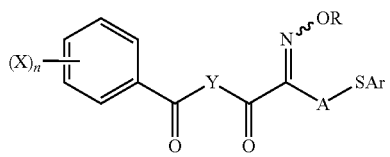

(OX-2)

(In formula (OX-2), each of R and X independently represents a monovalent substituent, each of A and Y independently represents a divalent organic group, Ar represents an aryl group, and n is an integer of 0 to 5.)

R, A and Ar in formula (OX-2) have the same meanings as R, A and Ar in formula (OX-1), and preferred examples thereof are also the same.

Examples of the monovalent substituent represented by X in formula (OX-2) include an alkyl group, an aryl group, an alkoxy group, an aryloxy group, an acyloxy group, an acyl group, an alkoxycarbonyl group, an amino group, a hetero- cyclic group, and a halogen group. These groups may have one or more substituents. Examples of the substituent include the substituents described above. Also, the substituent described above may be further substituted with another substituent.

Among these, from the standpoint of enhancing the solvent solubility and absorption efficiency in the long wavelength region, X in formula (OX-2) is preferably an alkyl group.

In formula (OX-2), n represents an integer of 0 to 5 and is preferably an integer of 0 to 2.

The divalent organic group represented by Y in formula (OX-2) includes the following structures. In the groups shown below, "*" indicates a bonding position between Y and the adjacent carbon atom in formula (OX-2).

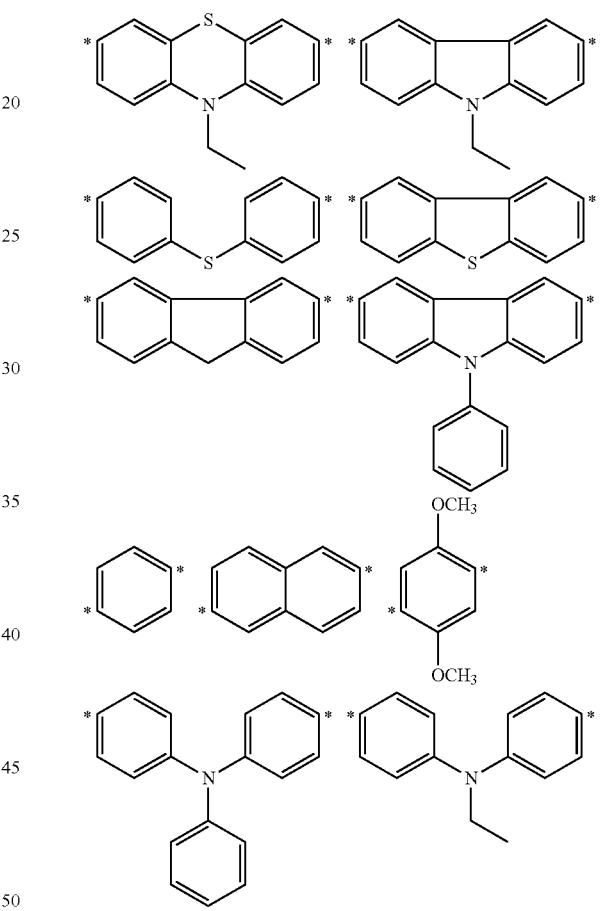

Among these, from the standpoint of achieving high sensitivity, structures shown below are preferred.

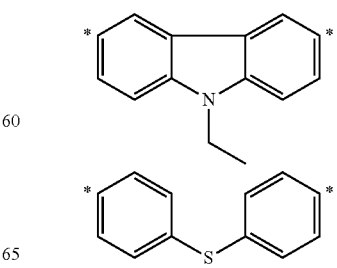

Furthermore, the oxime compound is preferably a compound represented by the following formula (OX-3):

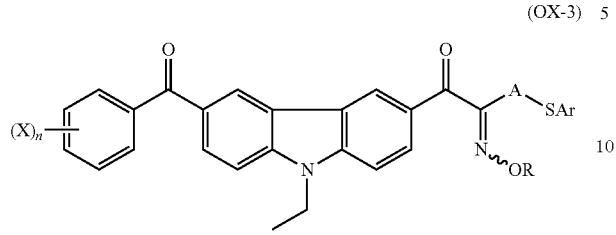

(OX-3)

(In formula (OX-3), each of R and X independently represents a monovalent substituent, A represents a divalent organic group, Ar represents an aryl group, and n is an integer of 0 to 5.)

R, X, A, Ar and n in formula (OX-3) have the same meanings as R, X, A, Ar and n, respectively, in formula (OX-2), and preferred examples thereof are also the same.

Specific examples (B-1) to (B-10) of the oxime compound which is suitably used are illustrated below, but the present invention is not limited thereto.

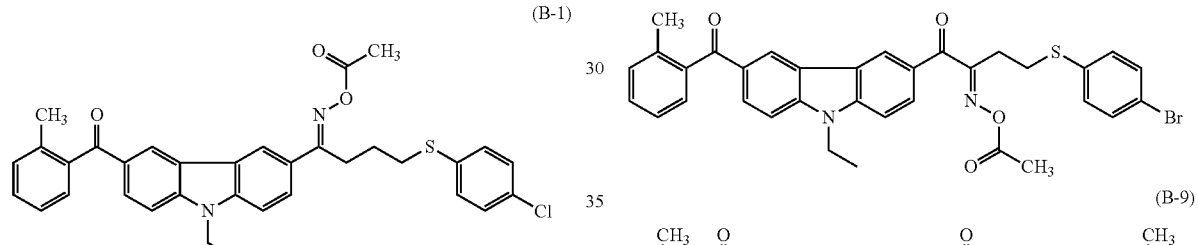

(B-1)

(B-2)

(B-3)

(B-4)

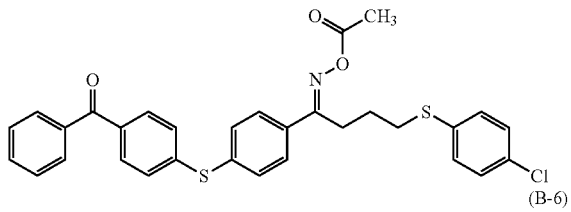

(B-5)

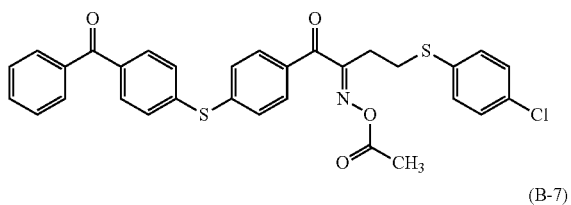

(B-6)

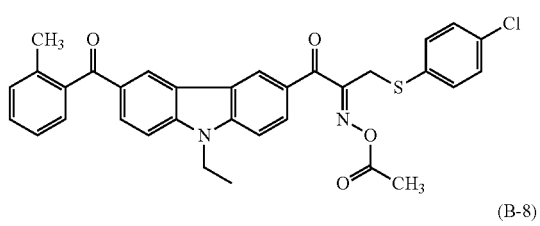

(B-7)

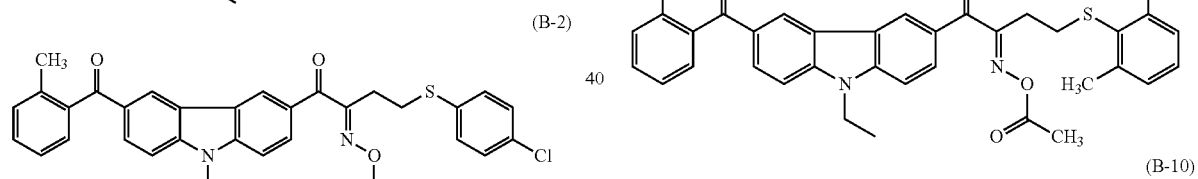

(B-8)

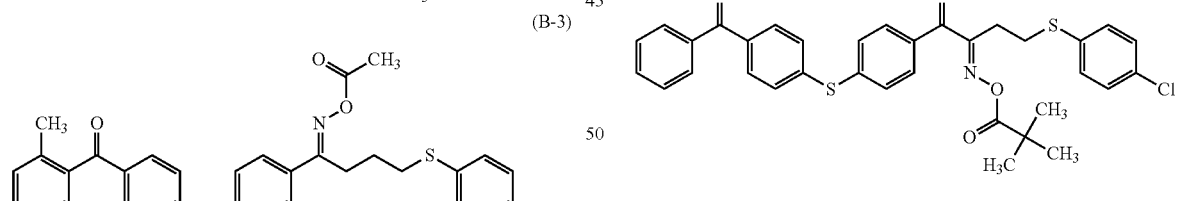

(B-9)

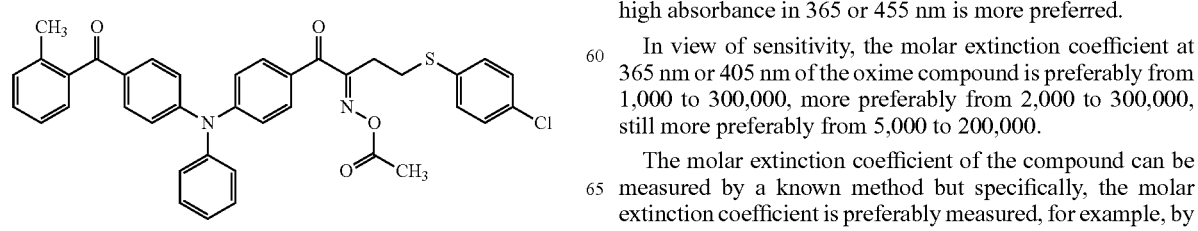

(B-10)

The oxime compound has a maximum absorption wavelength in the wavelength region of 350 to 500 nm. A compound having an absorption wavelength in the wavelength region of 360 to 480 nm is preferred, and a compound having high absorbance in 365 or 455 nm is more preferred.

In view of sensitivity, the molar extinction coefficient at 365 nm or 405 nm of the oxime compound is preferably from 1,000 to 300,000, more preferably from 2,000 to 300,000, still more preferably from 5,000 to 200,000.

The molar extinction coefficient of the compound can be measured by a known method but specifically, the molar extinction coefficient is preferably measured, for example, by an ultraviolet-visible spectrophotometer (Carry-5 spectrophotometer, manufactured by Varian Inc.) at a concentration of 0.01 g/L by using an ethyl acetate solvent.

As to the polymerization initiator for use in the present invention, two or more initiators may be used in combination, if desired.

In view of exposure sensitivity, the polymerization initiator used in the adhesive composition of the present invention is preferably a compound selected from the group consisting of a trihalomethyltriazine compound, a benzyldimethyl ketal compound, an α-hydroxyketone compound, an α-aminoketone compound, an acylphosphine compound, a phosphine oxide compound, a metallocene compound, an oxime compound, a triallylimidazole dimer, an onium compound, a benzothiazole compound, a benzophenone compound, an acetophenone compounds and derivatives thereof, a cyclopentadiene-benzene-iron complex and a salt thereof, a halomethyloxadiazole compound, and a 3-aryl substituted coumarin compound.

The compound is more preferably a trihalomethyltriazine compound, an α-aminoketone compound, an acylphosphine compound, a phosphine oxide compound, an oxime compound, a triallylimidazole dimer, an onium compound, a benzophenone compound or an acetophenone compound, and most preferably at least one compound selected from the group consisting of a trihalomethyltriazine compound, an α-aminoketone compound, an oxime compound, a triallylimidazole dimer and a benzophenone compound.

The content of the polymerization initiator (in the case of using two or more compounds, the total content) is preferably from 0.1 to 50 mass %, more preferably from 0.1 to 30 mass %, still more preferably from 0.1 to 20 mass %, based on the total solid content of the adhesive composition. Within this range, good sensitivity is obtained.

(D) Surfactant

From the standpoint of more enhancing the coatability, various surfactants may be added to the adhesive composition of the present invention. As the surfactant, various surfactants such as fluorine-containing surfactant, nonionic surfactant, cationic surfactant, anionic surfactant and silicone-containing surfactant may be used.

In particular, by containing a fluorine-containing surfactant in the adhesive composition of the present invention, the liquid characteristics (particularly fluidity) of a coating solution prepared is more enhanced, so that the coating thickness uniformity or the liquid-saving property can be more improved.

That is, in the case of forming a film by using a coating solution to which the adhesive composition containing a fluorine-containing surfactant is applied, the interface tension between a to-be-coated surface and the coating solution is reduced, whereby wettability to the to-be-coated surface is improved and the coatability on the to-be-coated surface is enhanced. This is effective in that even when a thin film of about several μm is formed with a small liquid volume, formation of a film with little thickness unevenness and uniform thickness can be performed in a more preferable manner.

The fluorine content in the fluorine-containing surfactant is preferably from 3 to 40 mass %, more preferably from 5 to 30 mass %, still more preferably from 7 to 25 mass %. The fluorine-containing surfactant having a fluorine content in the range above is effective in view of thickness uniformity of the coated film and liquid-saving property and also exhibits good solubility in the adhesive composition.

Examples of the fluorine-containing surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, Megaface F781 (all produced by DIC Corp.), Florad FC430, Florad FC431, Florad FC171 (all produced by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon 5393, Surflon KH-40 (all produced by Asahi Glass Co., Ltd.), PF636, PF656, PF6320, PF6520, and PF7002 (all produced by OMNOVA).

Specific examples of the nonionic surfactant include glycerol, trimethylolpropane, trimethylolethane, their ethoxylate and propoxylate (such as glycerol propoxylate and glycerin ethoxy late), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (PLURONIC L10, L31, L61, L62, 10R5, 17R2 and 25R2, TETRONIC 304, 701, 704, 901, 904 and 150R1 (all produced by BASF), and Solsperse 20000 (produced by The Lubrizol Corporation)).

Specific examples of the cationic surfactant include a phthalocyanine derivative (EFKA-745, trade name, produced by Morishita Sangyo K.K.), an organosiloxane polymer KP341 (produced by Shin-Etsu Chemical Co., Ltd.), (meth) acrylic acid-based (co)polymers Polyflow No. 75, No. 90, No. 95 (produced by Kyoeisha Chemical Co., Ltd.), and W001 (produced by Yusho Co., Ltd.).

Specific examples of the anionic surfactant include W004, W005 and W017 (all produced by Yusho Co., Ltd.).

Examples of the silicone-containing surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA" and "Toray Silicone SH8400", produced by Dow Corning Toray Silicone Co., Ltd.; "TSF-4440", "TSF-4300", "TSF-4445", "TSF-4460" and "TSF-4452", produced by Momentive Performance Materials; "KP341", "KF6001" and "KF6002", produced by Shin-Etsu Silicone Co., Ltd.; and "BYK307", "BYK323" and "BYK330", produced by Byk Chemie.

Only one surfactant may be used, or two or more kinds of surfactants may be combined.

The amount of the surfactant added is preferably from 0.001 to 2.0 mass %, more preferably from 0.005 to 1.0 mass %, based on the total mass of the adhesive composition.

[E] Solvent

The adhesive composition of the present invention can be generally constructed by using a solvent (usually an organic solvent.). The solvent is fundamentally not particularly limited as long as it satisfies the solubility of each component and the coatability of the adhesive composition.

Preferred examples of the organic solvent include esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (such as methyl oxyacetate, ethyl oxyacetate and butyl oxyacetate (e.g., methyl methoxyacetate, ethyl methoxyacetate, butyl methoxyacetate, methyl ethoxyacetate, ethyl ethoxyacetate)), 3-oxypropionic acid alkyl esters (such as methyl 3-oxypropionate and ethyl 3-oxypropionate (e.g., methyl 3-methoxypropionate, ethyl 3-methoxypropionate, methyl 3-ethoxypropionate, ethyl 3-ethoxypropionate)), 2-oxypropionic acid alkyl esters (such as methyl 2-oxypropionate, ethyl 2-oxypropionate and propyl 2-oxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate or ethyl 2-oxy-2-methylpropionate (such as methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate and propylene glycol monopropyl ether acetate; ketones such as methyl ethyl ketone, cyclohexanone, 2-heptanone and 3-heptanone; and aromatic hydrocarbons such as toluene and xylene.

From the standpoint of, for example, improving the coated surface state, an embodiment of mixing two or more of these organic solvents is also preferred. In this case, a mixed solution composed of two or more members selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate, is particularly preferred.

In view of coatability, the content of the solvent in the adhesive composition is preferably adjusted such that the total solid content concentration of the composition becomes preferably from 5 to 80 mass %, more preferably from 5 to 70 mass %, still more preferably from 10 to 60 mass %.

In the adhesive composition of the present invention, if desired, various additives such as curing agent, curing catalyst, polymerization inhibitor, silane coupling agent, filler, adherence accelerator, antioxidant, ultraviolet absorber and aggregation inhibitor can be blended as long as the effects of the present invention are not impaired.

As described above, in this description, a manufacturing method of a semiconductor device indicated by the following [1] to [14] is disclosed.

[1] A method for manufacturing a semiconductor device with a treated member, comprising:
subjecting an adhesive support having a substrate and an adhesive layer capable of increasing or decreasing in the adhesiveness upon irradiation with an actinic ray, radiation or heat to irradiation of the adhesive layer with the actinic ray, radiation or heat,
adhering (bonding) a first surface of a to-be-treated member to the adhesive layer of the adhesive support,
applying a mechanical or chemical treatment to a second surface different from the first surface of the to-be-treated member to obtain a treated member, and
detaching a first surface of the treated member from the adhesive layer of the adhesive support,
wherein the adhesive layer is irradiated with the actinic ray, radiation or heat such that the adhesiveness decreases toward the outer surface from the inner surface on the substrate side of the adhesive layer.

[2] The method for manufacturing a semiconductor device as described in the above-described [1], wherein:
the to-be-treated member has a to-be-treated base material and a protective layer provided on a first surface of the to-be-treated base material,
a surface of the protective layer opposite the to-be-treated base material is the first surface of the to-be-treated member, and a second surface different from the first surface of the to-be-treated base material is the second surface of the to-be-treated member.

[3] The method for manufacturing a semiconductor device as described in the above-described [2], wherein the to-be-treated member is a to-be-treated member in which a device chip is provided on the first surface of the to-be-treated base material and the device chip is protected by the protective layer.

[4] The method for manufacturing a semiconductor device as described in any one of the above-described [1] to [3], wherein the adhesive layer is an adhesive layer capable of decreasing in the adhesiveness upon irradiation with an actinic ray, radiation or heat and the irradiation with an actinic ray, radiation or heat is applied toward the outer surface of the adhesive layer.

[5] The method for manufacturing a semiconductor device as described in any one of the above-described [1] to [3], wherein the adhesive layer is an adhesive layer capable of increasing in the adhesiveness upon irradiation with heat and the irradiation with heat is applied toward the inner surface of the adhesive layer.

[6] The method for manufacturing a semiconductor device as described in any one of the above-described [1] to [5], wherein the to-be-treated member is a silicon substrate or a compound semiconductor substrate.

[7] The method for manufacturing a semiconductor device as described in the above-described [6], wherein the to-be-treated member is a silicon substrate.

[8] The method for manufacturing a semiconductor device as described in the above-described [7], wherein the mechanical or chemical treatment includes a thinning treatment of the silicon substrate.

[9] The method for manufacturing a semiconductor device as described in the above-described [8], wherein the mechanical or chemical treatment includes, after the thinning treatment of the silicon substrate, a treatment of forming a through hole in the silicon substrate and forming a through-silicon via in the through hole.

[10] The method for manufacturing a semiconductor device as described in any one of the above-described [7] to [9], wherein the to-be-treated member is a silicon substrate having a thickness of 200 to 1,200 μm.

[11] The method for manufacturing a semiconductor device as described in any one of the above-described [7] to [10], wherein the to-be-treated member is a silicon substrate having a thickness of 1 to 200 μm.

[12] The method for manufacturing a semiconductor device as described in the above-described [6], wherein the to-be-treated member is a compound semiconductor substrate and the compound semiconductor substrate is an SiC substrate, an SiGe substrate, a ZnS substrate, a ZnSe substrate, a GaAs substrate, an InP substrate or a GaN substrate.

[13] The method for manufacturing a semiconductor device as described in any one of the above-described [1] to [12], wherein the treated member is detached from the adhesive support by sliding the treated member with respect to the adhesive layer of the adhesive support or separating the treated member from the adhesive layer of the adhesive support.

[14] The method for manufacturing a semiconductor device as described in any one of the above-described [1] to [13], wherein the adhesive layer has a multilayer structure.

EXAMPLES

<Formation of Adhesive Support>

Each adhesive composition according to the formulation shown in Table 1 below was coated on a 4-inch Si wafer having a thickness of 525 μm by a spin coater (Opticoat MS-A100, manufactured by Mikasa, 1,200 rpm, 30 seconds) and then baked at 100° C. for 30 seconds to form Wafer 1 having provided thereon an adhesive layer with a thickness of 5 μm (that is, adhesive support).

<Exposure>

From the adhesive layer side of Wafer 1, the entire surface of the adhesive layer was exposed using a UV exposure apparatus (LC8, manufactured by Hamamatsu Photonics K.K.). The exposure was performed by changing the exposure dose as shown in Table 2 below in each of Examples.

<Preparation of Test Piece>

Wafer 1 after exposure of the adhesive layer was cut in a rectangle shape of 0.5 cm×2 CM.

Figure 7:
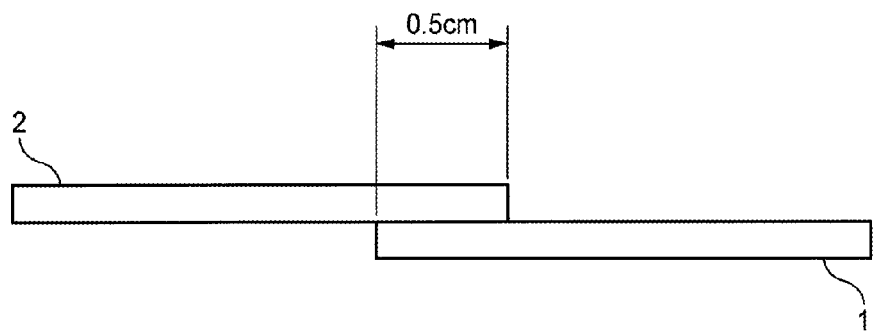
FIG. 7 is a schematic cross-sectional view of the adhesive support test piece used in the measurement of adhesiveness.

Wafer 2 where nothing is coated on the surface was cut in a rectangle shape of 0.5 cm×2 cm. Wafer 1 and Wafer 2 were adhered under pressure of 20 N/cm$^2$ such that the region up to 0.5 cm from the longitudinal edge part of the adhesive layer of Wafer 1 overlaps with the region up to 0.5 cm from the longitudinal edge part of Wafer 2 (see, the schematic cross-sectional view of the test piece shown in FIG. 7).

<Measurement of Adhesive Force>

As for the shear adhesive force of the test piece prepared above, tensile measurement was performed under the condition of 250 mm/min by using a tensile tester (manufactured by IMADA). The results are shown in Table 2 below.

TABLE 1

| Adhesive Composition | Resin | | Polymerizable Compound | | Polymerization Initiator | | Surfactant | | Solvent | |
|---|---|---|---|---|---|---|---|---|---|---|
| | Kind | Content (g) | Kind | Content (g) | Kind | Content (g) | Kind | Content (g) | Kind | Content (g) |
| Composition 1 | A | 25 | C | 75 | E | 6 | F | 0.02 | MEK | 150 |
| Composition 2 | A | 25 | D | 75 | E | 6 | F | 0.02 | MEK | 150 |
| Composition 3 | B | 50 | C | 50 | E | 6 | F | 0.02 | PGMEA | 150 |
| Composition 4 | B | 50 | D | 50 | E | 6 | F | 0.02 | PGMEA | 150 |

Abbreviations in Table 1 stand for the followings.

Resin A

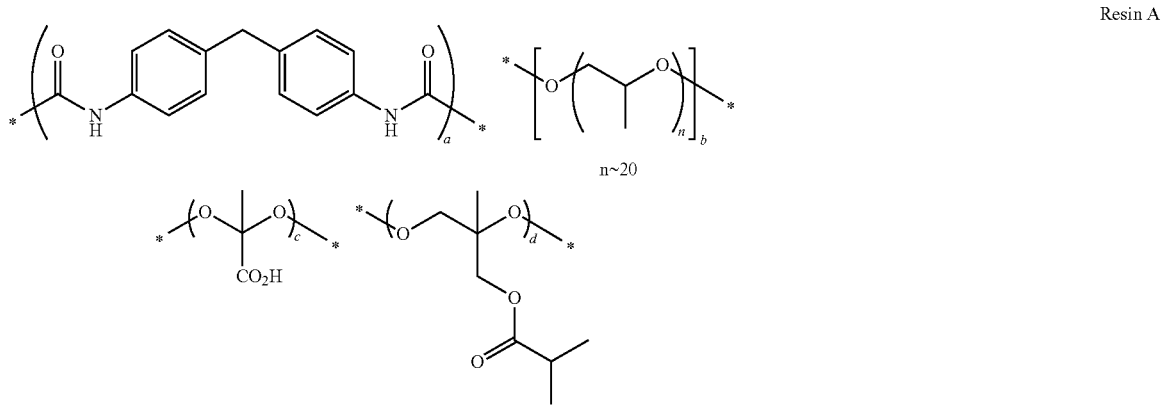

Mw: 30,000
a/b/c/d = 50.0/3.8/26.5/19.7 (mol %)
a/b/c/d = 53.3/19.0/14.7/13.0 (wt %)

Resin B

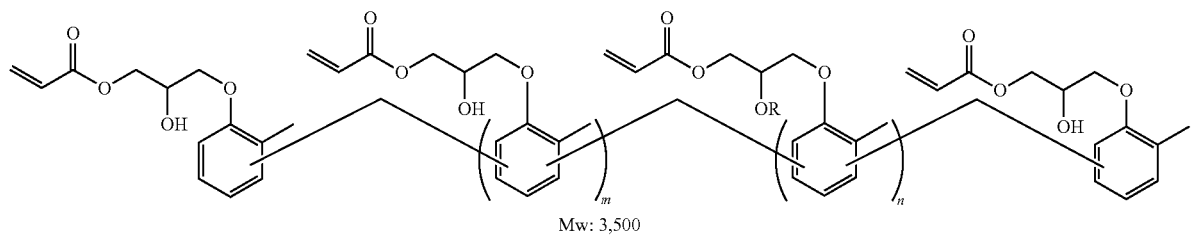

Mw: 3,500 m + n = 11, m/(m + n) ≈ 0.5

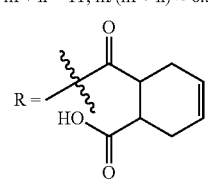

Polymerizable Compound C

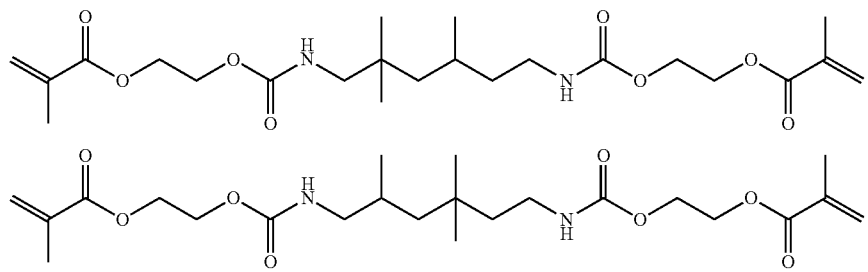

(A mixture of upper and lower compounds (mass ratio: 1:1))

Polymerizable Compound D:

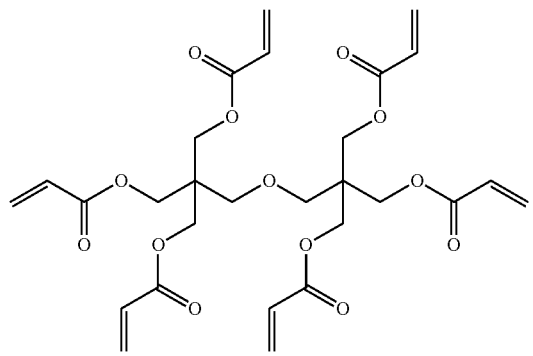

Polymerization Initiator E:

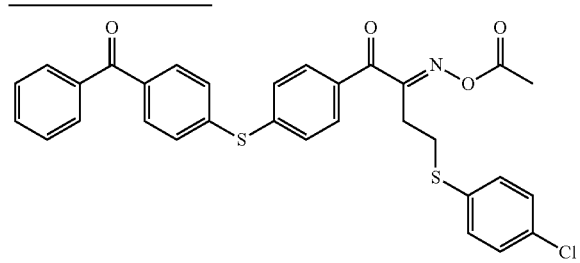

Surfactant F:

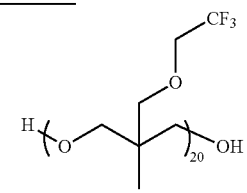

PF-6320 produced by Kitamura Chemicals Co., Ltd.
MEK: Methyl ethyl ketone
PGMEA: Propylene glycol monomethyl ether acetate

TABLE 2

| | Exposure Dose (mJ/cm$^2$) (in terms of wavelength of 254 nm) | Shear Adhesive Force (N/25 mm$^2$) |
|---|---|---|
| Composition 1 | 0 | 35 |
| | 0.2 | 10 |
| | 100 | 0* |
| Composition 2 | 0 | 27 |
| | 0.2 | 9 |
| | 100 | 0* |
| Composition 3 | 0 | 35 |
| | 0.2 | 11 |
| | 100 | 0* |
| Composition 4 | 0 | 10 |
| | 0.2 | 2 |
| | 100 | 0* |

*Separated on fixing to the measuring machine.

As seen above, the adhesive layer formed using any of Compositions 1 to 4 was decreased in the adhesiveness by exposure. More specifically, a correlation between a larger exposure dose and a lower shear adhesive force was obtained.

It was understood therefrom that each of the adhesiveness on the outer surface and the adhesiveness on the inner surface can be controlled with good precision by adjusting the exposure dose.

Accordingly, when such an adhesive layer is used as the adhesive layer of an adhesive support and exposure is applied to the adhesive layer, the adhesiveness can be easily controlled with high precision to such a degree that a to-be treated member can be temporarily supported in a reliable manner and at the same time, the temporary support for the treated member can be easily released without damaging the treated member. In turn, as described above, a to-be-treated member can be temporarily supported in a reliable and easy manner when applying a mechanical or chemical treatment to the to-be-treated member and at the same time, the temporary support for the treated member can be easily released without damaging the treated member.

This application is based on Japanese Patent application JP 2012-046856, filed on Mar. 2, 2012 and Japanese Patent application JP 2012-134188, filed on Jun. 13, 2012, the entire contents of which are hereby incorporated by reference, the same as if fully set forth herein.

The invention claimed is:

1. A method for manufacturing a semiconductor device with a treated member, comprising:
   subjecting an adhesive support having a substrate and an adhesive layer capable of increasing or decreasing in adhesiveness upon irradiation with an actinic ray, radiation or heat to irradiation of the adhesive layer with an actinic ray, radiation or heat,
   adhering a first surface of a to-be-treated member to the adhesive layer of the adhesive support,
   applying a mechanical or chemical treatment to a second surface different from the first surface of the to-be-treated member to obtain a treated member, and
   detaching a first surface of the treated member from the adhesive layer of the adhesive support,
   wherein the irradiation of the adhesive layer with an actinic ray, radiation or heat is conducted so that adhesiveness decreases toward an outer surface from an inner surface on the substrate side of the adhesive layer.

2. The method for manufacturing a semiconductor device as claimed in claim 1, wherein:
   the to-be-treated member has a to-be-treated base material and a protective layer provided on a first surface of the to-be-treated base material,
   a surface of the protective layer opposite the to-be-treated base material is the first surface of the to-be-treated member, and
   a second surface different from the first surface of the to-be-treated base material is the second surface of the to-be-treated member.

3. The method for manufacturing a semiconductor device as claimed in claim 2, wherein the to-be-treated member is a to-be-treated member in which a device chip is provided on the first surface of the to-be-treated base material and the device chip is protected by the protective layer.

4. The method for manufacturing a semiconductor device as claimed in claim 1, wherein the adhesive layer is an adhesive layer capable of decreasing in adhesiveness upon irradiation with an actinic ray, radiation or heat and the irradiation with an actinic ray, radiation or heat is applied toward the outer surface of the adhesive layer.

5. The method for manufacturing a semiconductor device as claimed in claim 1, wherein the adhesive layer is an adhesive layer capable of increasing in adhesiveness upon irradiation with heat and the irradiation with heat is applied toward the inner surface of the adhesive layer.

6. The method for manufacturing a semiconductor device as claimed in claim 1, wherein the to-be-treated member is a silicon substrate or a compound semiconductor substrate.

7. The method for manufacturing a semiconductor device as claimed in claim 6, wherein the to-be-treated member is a silicon substrate.

8. The method for manufacturing a semiconductor device as claimed in claim 7, wherein the mechanical or chemical treatment comprises a thinning treatment of the silicon substrate.

9. The method for manufacturing a semiconductor device as claimed in claim 8, wherein the mechanical or chemical treatment comprises, after the thinning treatment of the silicon substrate, a treatment of forming a through hole in the silicon substrate and forming a through-silicon via in the through hole.

10. The method for manufacturing a semiconductor device as claimed in claim 7, wherein the to-be-treated member is a silicon substrate having a thickness of 200 to 1,200 µm.

11. The method for manufacturing a semiconductor device as claimed in claim 7, wherein the to-be-treated member is a silicon substrate having a thickness of 1 to 200 µm.

12. The method for manufacturing a semiconductor device as claimed in claim 6, wherein the to-be-treated member is a compound semiconductor substrate and the compound semiconductor substrate is an SiC substrate, an SiGe substrate, a ZnS substrate, a ZnSe substrate, a GaAs substrate, an InP substrate or a GaN substrate.

13. The method for manufacturing a semiconductor device as claimed in claim 1, wherein the treated member is detached from the adhesive support by sliding the treated member with respect to the adhesive layer of the adhesive support or separating the treated member from the adhesive layer of the adhesive support.

14. The method for manufacturing a semiconductor device as claimed in claim 1, wherein the adhesive layer has a multilayer structure.

* * * * *